US012382830B2

(12) United States Patent
Venkatasubramanian

(10) Patent No.: US 12,382,830 B2
(45) Date of Patent: Aug. 5, 2025

(54) LARGE AREA SCALABLE FABRICATION METHODOLOGIES FOR VERSATILE THERMOELECTRIC DEVICE MODULES

(71) Applicant: The Johns Hopkins University, Baltimore, MD (US)

(72) Inventor: Rama Venkatasubramanian, Cary, NC (US)

(73) Assignee: The Johns Hopkins University, Baltimore, MD (US)

( * ) Notice: Subject to any disclaimer, the term of this patent is extended or adjusted under 35 U.S.C. 154(b) by 0 days.

(21) Appl. No.: 17/575,727

(22) Filed: Jan. 14, 2022

(65) Prior Publication Data

US 2022/0416144 A1    Dec. 29, 2022

Related U.S. Application Data

(60) Provisional application No. 63/213,886, filed on Jun. 23, 2021.

(51) Int. Cl.
    *H10N 10/01*      (2023.01)
    *H10N 10/82*      (2023.01)
    *H10N 10/852*     (2023.01)

(52) U.S. Cl.
    CPC ............. *H10N 10/01* (2023.02); *H10N 10/82* (2023.02); *H10N 10/852* (2023.02)

(58) Field of Classification Search
    None
    See application file for complete search history.

(56) References Cited

U.S. PATENT DOCUMENTS

| 4,828,627 A * | 5/1989 | Connery ................ H10N 10/17 136/203 |
| 7,679,203 B2 | 3/2010 | Bharathan et al. |

(Continued)

FOREIGN PATENT DOCUMENTS

WO        9844562 A1    10/1998

OTHER PUBLICATIONS

Wafer World, "Silicon Manufacturing—Why Are Silicon Wafers Round?", 2018, https://www.waferworld.com/post/silicon-wafer-manufacturing-shape, pp. 1-2. (Year: 2018).*
International Search Report (PCT/ISA/210) and Written Opinion (PCT/ISA/237) issued by the EPO on Sep. 22, 2022 in PCT/US2022/034711.

(Continued)

*Primary Examiner* — Daniel P Malley, Jr.
(74) *Attorney, Agent, or Firm* — Sung T. Kim

(57) ABSTRACT

Systems, apparatuses, and methods are provided for scalable manufacturing of thermoelectric device modules for multiple uses on a single substrate. An example method can include disposing thermoelectric structures on a substrate, the substrate having a first substrate material, and the thermoelectric structures having a thermoelectric material disposed on a second substrate material. The example method can further include removing the second substrate material from each of the thermoelectric structures. The example method can further include forming electrical contacts on a top surface of each respective one of the thermoelectric structures. The example method can further include forming top headers over subsets of the electrical contacts. The example method can further include forming thermoelectric device modules, each of the thermoelectric device modules having at least a pair of the thermoelectric structures and at least one of the top headers.

26 Claims, 16 Drawing Sheets

(56) References Cited

U.S. PATENT DOCUMENTS

| | | | | |
|---|---|---|---|---|
| 10,903,139 | B2 | 1/2021 | Venkatasubramanian et al. | |
| 2006/0289052 | A1* | 12/2006 | O'Quinn | H10N 10/01 |
| | | | | 136/201 |
| 2007/0215194 | A1* | 9/2007 | Bharathan | H10N 10/01 |
| | | | | 136/200 |
| 2008/0185030 | A1* | 8/2008 | Pierce | H10N 10/17 |
| | | | | 257/E27.008 |
| 2010/0252087 | A1* | 10/2010 | Deane | H10N 10/817 |
| | | | | 136/200 |
| 2012/0048321 | A1* | 3/2012 | Danenberg | H10N 10/17 |
| | | | | 136/200 |
| 2018/0138106 | A1* | 5/2018 | Venkatasubramanian | |
| | | | | H10N 10/17 |
| 2021/0151360 | A1 | 5/2021 | Venkatasubramanian et al. | |

OTHER PUBLICATIONS

Kerrigan, K. (Aug. 23, 2023). Johns Hopkins APL's Ultracompact, Efficient Cooling Device Earns 2023 R&D 100 Award [Press Release]. https://www.jhuapl.edu/news/news-releases/230823a-apl-wins-2023-rd100-award.

Mu, X., Wang, L., Yang, X. et al. Ultra-low Thermal Conductivity in Si/Ge Hierarchical Superlattice Nanowire. Sci Rep 5, 16697 (2015). https://doi.org/10.1038/srep16697.

Osborn, L.E., Venkatasubramanian, R., Himmtann, M. et al. Evoking natural thermal perceptions using a thin-film thermoelectric device with high cooling power density and speed. Nat. Biomed. Eng (2023). https://doi.org/10.1038/s41551-023-01070-w.

* cited by examiner

LARGE AREA SCALABLE FABRICATION METHODOLOGIES FOR VERSATILE THERMOELECTRIC DEVICE MODULES

CROSS-REFERENCE TO RELATED APPLICATIONS

The present application claims priority to U.S. Provisional Patent Application No. 63/213,886, filed Jun. 23, 2021, and titled "Large Area Scalable Fabrication Methodologies for Versatile Thin-Film Thermoelectric Device Modules," the content of which is incorporated by reference herein in its entirety.

TECHNICAL FIELD

The present disclosure relates to thermoelectric device modules and methods for large area, scalable fabrication of thermoelectric device modules.

BACKGROUND

Application of solid state thermoelectric cooling is expected to improve the operation of high-performance electronics including microprocessors, optoelectronics (e.g., lasers, light emitting diodes (LEDs), infrared (IR) imagers, etc.), radio frequency (RF) electronics (e.g., communication devices in smartphones and satellites, radio frequency receiver front-ends), superconducting electronics, and sensors (e.g., ultra-sensitive magnetic signature sensors, etc.). Similarly, efficient and low-cost solid state thermoelectric modules are useful for heat harvesting at various temperature regimes, using optimal thermoelectric materials for each temperature regime, such as low-grade or low-temperature heat (e.g., <200° C.), medium-grade or medium-temperature heat (e.g., <500° C.) and high-temperature heat (e.g., <1200° C.). However, large-scale production of thermoelectric modules has been less explored due to the inferior properties of materials involved in thermoelectric module fabrication, which has limited the number of applications in which thermoelectric modules have been utilized and, in turn, resulted in higher per-unit manufacturing costs and longer per-unit production times. Further, even as the thermoelectric figures of merit (ZTs) of thermoelectric materials are improved for higher efficiency and other performance advantages are developed, new ways of manufacturing are still needed to lower the cost and increase the reliability and scale-up of thermoelectric modules manufactured using these improved materials.

SUMMARY

The present disclosure describes various aspects of systems, apparatuses, and methods for large area scalable fabrication of versatile bulk thermoelectric device modules, thin-film thermoelectric device modules, or both.

In some aspects, the present disclosure describes a method for manufacturing thermoelectric device modules. The method can include disposing thermoelectric structures on a substrate. The substrate can include a first substrate material. The thermoelectric structures can include a thermoelectric material disposed on a second substrate material. The method can further include removing the second substrate material from each of the thermoelectric structures. The method can further include forming electrical contacts on a top surface of each respective one of the thermoelectric structures. The method can further include forming top headers over subsets of the electrical contacts. The method can further include forming thermoelectric device modules. Each of the thermoelectric device modules can include at least a pair of the thermoelectric structures and at least one of the top headers.

In some aspects, the present disclosure describes a plurality of thermoelectric device modules manufactured according to any of the methods described herein or combinations thereof.

In some aspects, the present disclosure describes an apparatus. The apparatus can include a substrate and thermoelectric device modules disposed on the substrate. Each of the thermoelectric device modules can include a first thermoelectric structure disposed on the substrate and a second thermoelectric structure disposed on the substrate adjacent to the first thermoelectric structure. Each of the thermoelectric device modules can further include first electrical contacts disposed on a first top surface of the first thermoelectric structure and second electrical contacts disposed on a second top surface of the second thermoelectric structure. Each of the thermoelectric device modules can further include a top header formed over at least one of the first electrical contacts and one of the second electrical contacts.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
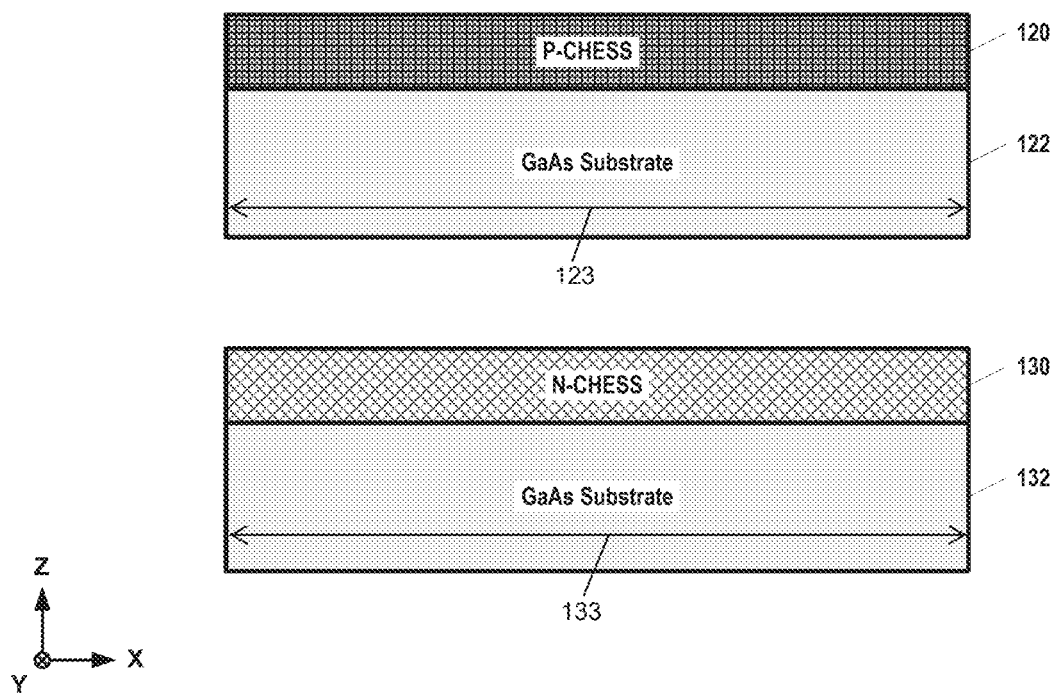
FIGS. 1A, 1B, 1C, 1D, 1E, 1F, and 1G are schematic illustrations of example process flow steps for fabricating large area scalable thin-film thermoelectric device modules according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings or as the only approach to implementation of the disclosure rather than an example approach.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In one example, thin-film thermoelectric (TE) modules are often processed individually as strips containing 10 to 12 P-N couples, using p- and n-type strips from original p-type and n-type epi wafers. This makes TE device fabrication very time-intensive and costly. Further, large-array modules can involve intense pick-and-place tool assembly.

The large area scalable fabrication of thin-film thermoelectric coolers (TFTEC) and thin-film thermoelectric generation (TFTEG) devices can be integral to lowering the manufacturing cost of TE modules for volume applications. However, the implementation of large area scalable fabrication device process technology has been limited due to the chemical incompatibility issues between p-type and n-type materials with photoresist technology and e-beam evaporated contacts. As a result, thin-film module fabrication can be time-consuming. However, there is a need for thin-film module fabrication to be scaled up like integrated circuit (IC) technology that has been used in today's semiconductor electronic chips, but with the unique features of thermoelectric device modules, so that it can be practiced with the tools available from the semiconductor industry.

The present disclosure provides methods for fabricating thin-film thermoelectric cooling and power generation devices in a scalable and manufacturable way using a wafer-scale process. The wafer-scale process mitigates the chemical incompatibility issues between p-type and n-type materials with photoresist technology and e-beam evaporated contacts by utilizing a combination of photoresist coating developed in required areas with photolithography tools and electroplating on required areas to enable large area scalable fabrication thin-film TE device technology. Such a process can lead to lowering the cost of TE modules for a wide array of applications as well as improving reproducibility. Similar to how semiconductor large area technology allows many types of devices (e.g., logic, memory, communication, analog-to-digital (A/D), digital-to-analog (D/A), etc.) on the same chip, the present disclosure provides a versatile thin-film thermoelectric technology for a wide variety of applications on a single wafer. Such large-area scalable manufacturing of versatile thin-film device technology can lead to a variety of cooling, thermal control, thermal energy harvesting devices from the same wafer leading to lowering of cost and versatility of use.

The present disclosure provides several exemplary aspects such as those detailed below as non-limiting examples.

1. Each P and N strip is about 0.1 millimeter (mm) to 0.3 mm and on average about 0.2 mm wide. Thus, each pair of P-N strips, with a gap of about 100 micrometers (microns) between them, is about 0.5 mm wide. Thus, for a 5.0 centimeter (cm) long and 0.5 mm wide P-N couple pair of strips, each pair of P and N strips occupies an area of 5.0 cm by 0.05 cm, or 0.25 $cm^2$. Assuming that only about 85% of an 8 inch (in) handle wafer with a total area of 324 $cm^2$ is used for fabricating P-N pairs, that 8 in handle wafer can accommodate about 1,100 pairs of P-N strips 2. Typical geometries of electrical contacts are about 25 microns to about 250 microns. Metal contact sizes can vary over the entire wafer, depending on need. Accordingly, with an average electrical contact of about 100 microns, and P and N strip lengths of about 2 inch ("in") (about 5 cm), about 400 pairs of P-N couples can be produced per pair of strips.

3. From these, an estimated 440,640 P-N couple pairs can be produced per 8 in handle wafer. Similarly, an estimated 688,500 P-N couple pairs can be produced per 10 inch handle wafer, and an estimated 908,820 P-N couple pairs can be produced per 12 inch handle wafer. Such a large number of P-N couple pairs on a single carrier wafer is unprecedented and provides opportunities for substantially lowering the costs of thermoelectric module fabrication.

4. In some aspects, not all strip lengths have to be 2 inches long. The strip lengths can vary from about 0.1 inch (about 2.54 mm) to about 2 inches (about 5 cm) from a 2 inch square epi wafer. Each 2 inch square epi wafer has an area of about 25.8 cm$^2$. Thus, about seven 2 inch square epi wafers of P and N-type, each, accounting for kerf losses, can populate an 8 inch handle wafer to form about 688,500 P-N couple pairs. In some aspects, more or less P-N couple pairs can be produced depending on electrical contact geometries used.

5. Depending on the electrical contact size used, each P-N couple pair can provide cooling of about 80 mW for a temperature difference (DT) of about 5 degrees Celsius (° C.); 60 mW for a DT of about 18° C.; and 40 mW for a DT of about 30° C. For reference, a DT of about 17° C. can be typical of an HVAC system on a hot day with outside heat rejection at about 100 degrees Fahrenheit (° F.) and inside vent at about 68° F.

6. Thus, for the case of 60 mW cooling, and 688,500 P-N couple pairs per 8 in handle wafer, about 41,310 watts (W) of cooling can be produced with the 688,500 P-N couple pairs. This is about 12 tons of cooling capacity per 8 in handle wafer with seven 2 inch square epi P-wafers and seven 2 inch square epi N-wafers. With typical 1 ton per 400 square feet (sqft) of information technology (IT) equipment floor space, this can provide cooling for a 5,000 sqft data server with TFTEC cooling devices produced from a single 8 in handle wafer using about seven 2 inch square P-CHESS epi and seven 2 inch square N-CHESS epi thin-film thermoelectric wafers.

7. In some aspects, the scalability of metal organic chemical vapor deposition (MOCVD) growth (e.g., at 2 inches square, or 6 inches in diameter) can be independent of 8 inch or 10 inch handle wafers using Si technology tools.

8. The 688,500 P-N couples per 8 in handle wafer can be turned into a variety of TE modules ranging from single-couple modules to hundreds-of-couple module arrays and can be used for applications ranging from thermotactiles for haptics to distributed HVAC cooling for a data center. This is an example of application agnostic manufacturing that can be carried out using the techniques and configurations disclosed herein, thus lowering the cost for substantially all applications.

There are many exemplary aspects to the systems, apparatuses, methods, and computer program products disclosed herein. For example, the wafer scale bulk TE or thin-film TE device technology described herein can provide for application-agnostic or multi-application targeted use. In another example, the combination of photoresist technology with electroplated electrical contacts, with a thermoelectric figure of merit (ZT) greater than 2.0 for p-type elements and a ZT of about 0.92 for n-type elements, allows for scalable wafer-scale type process technology. It must be noted, however, that the present disclosure relates to module fabrication technology having a ZT between about 0.3 and about 3.0 for p-type elements and a ZT of about 0.3 to about 3.0 for n-type elements at 300 Kelvin (K). Thus, the module fabrication technology may be material ZT-agnostic. In another example, electroplated contacts can remove any oxides in the "acidic" electroplating solutions and thereby achieve better/reproducible electrical contacts. As a result, the Large-area (e.g., wafer-scale) thin-film TE device technology disclosed herein can significantly increase the scalability of TE module production, the ruggedness of TE modules, and the multi-functionality of TE modules, lowering the cost of fabrication for a wide array of applications and minimizing some of the thermal parasitics and help with device geometry optimization. Additionally, the large area scalable fabrication of TFTECs and TFTEGs can allow for integrating discrete control circuitry such as controller chips for TECs and power management chips such as DC-DC conversion. Such discrete control circuitry chips can be integrated at a die-level by flip-chip bonding and can be co-located near the TFTEC and TFTEG modules. This can lead to more robust and rugged processes and lowering of overall product costs at the system-level.

In some aspects, the present disclosure describes a method for manufacturing thermoelectric device modules. The method can include disposing thermoelectric structures on a substrate. The substrate can include a first substrate material. The thermoelectric structures can include a thermoelectric material disposed on a second substrate material. The method can further include removing the second substrate material from each of the thermoelectric structures. The method can further include forming electrical contacts on a top surface of each respective one of the thermoelectric structures. The method can further include forming top headers over subsets of the electrical contacts. The method can further include forming thermoelectric device modules, wherein each of the thermoelectric device modules can include at least a pair of the thermoelectric structures and at least one of the top headers.

In some aspects, the substrate can include a carrier wafer. In some aspects, the first substrate material can include glass, silicon carbide (SiC), aluminum nitride (AlN), alumina ($Al_2O_3$), silicon (Si), or a flexible material such as Kapton™.

In some aspects, each of the thermoelectric structures can include a controlled hierarchical engineered superlattice structure (CHESS) structure or material. In some aspects, the thermoelectric structures can include p-type CHESS (P-CHESS) structures and n-type CHESS (N-CHESS) structures. In some aspects, the pair of thermoelectric structures can include one of the P-CHESS structures and one of the N-CHESS structures.

In some aspects, each of the P-CHESS structures can include a first CHESS material including first CHESS periods. In some aspects, each of the first CHESS periods can include a first p-type semiconductor material layer disposed adjacent to a second p-type semiconductor material layer. In some aspects, for each of the first CHESS periods, the first p-type semiconductor material layer can include p-type bismuth telluride ($Bi_2Te_3$), and the second p-type semiconductor material layer can include p-type antimony telluride ($Sb_2Te_3$) or a p-type bismuth selenide alloy ($Bi_2Te_{3-x}Se_x$). In some aspects, for each of the first CHESS periods, the first p-type semiconductor material layer can include a first periodic table Group V-VI, II-VI, or IV compound doped to form a second p-type semiconductor material, and the second p-type semiconductor material layer can include a second periodic table Group V-VI, II-VI, or IV compound doped to form a second p-type semiconductor material. As used herein, the term "semiconductor material" can include, but is not limited to, $Bi_2Te_3$, $Sb_2Te_3$, $Bi_2Te_{3-x}Se_x$, $Sb_{2-x}Bi_xTe_3$, Bi, Sb, PbTe, PbSe, $PbTe_{1-x}Se_x$, PbS, PnSnTe, Si, Ge, $Si_xGe_{1-x}$, or any other suitable material or combination thereof.

In some aspects, each of the N-CHESS structures can include a second CHESS material including second CHESS periods. In some aspects, each of the second CHESS periods can include a first n-type semiconductor material layer disposed adjacent to a second n-type semiconductor material layer. In some aspects, for each of the second CHESS periods, the first n-type semiconductor material layer can include n-type $Bi_2Te_3$, and the second n-type semiconductor material layer can include n-type $Sb_2Te_3$ or n-type $Bi_2Te_{3-x}Se_x$. In some aspects, for each of the second CHESS periods, the first n-type semiconductor material layer can include a first periodic table Group V-VI, II-VI, or IV compound doped to form a first n-type semiconductor material, and the second n-type semiconductor material layer can include a second periodic table Group V-VI, II-VI, or IV compound doped to form a second n-type semiconductor material.

In some aspects, the substrate can be a carrier substrate. In such aspects, the method can further include forming the P-CHESS structures on a first substrate, dicing the P-CHESS structures, and disposing the P-CHESS structures on the carrier substrate. The method can further include forming the N-CHESS structures on a second substrate, dicing the N-CHESS structures, and disposing the N-CHESS structures on the carrier substrate. In some aspects, the disposing the N-CHESS structures on the carrier substrate can include disposing each of the N-CHESS structures adjacent to one of the P-CHESS structures. In some aspects, a diameter of the first substrate can be less than a diameter of the carrier substrate, and a diameter of the second substrate can be less than the diameter of the carrier substrate.

In some aspects, the forming the electrical contacts can include forming a first subset of the electrical contacts on a first top surface of each respective one of a first subset of the thermoelectric structures, and forming a second subset of the electrical contacts on a second top surface of each respective one of a second subset the thermoelectric structures. In some aspects, a diameter of each of the first subset of the electrical contacts can be different from a diameter of each of the second subset of the electrical contacts. In some aspects, the diameter of each of the first subset of the electrical contacts can be at least about five times larger than the diameter of each of the second subset of the electrical contacts. In some aspects, the forming the top headers can include forming a first top header over the first subset of the electrical contacts, and forming a second top header over the second subset of the electrical contacts. In some aspects, a first thickness of the first top header can be about equal to a second thickness of the second top header. In some aspects, a first surface area of the first top header can be different from a second surface area of the second top header.

In some aspects, the thermoelectric device modules can include at least one hundred thousand P-N couple thermoelectric device modules.

In some aspects, the thermoelectric device modules can include a first thermoelectric device module configured to perform electronics cooling. In some aspects, the thermoelectric device modules can further include a second thermoelectric device module configured to perform refrigeration. In some aspects, the thermoelectric device modules can further include a third thermoelectric device module configured to perform air conditioning. In some aspects, the thermoelectric device modules can further include a fourth thermoelectric device module configured to perform thermal control. In some aspects, the thermoelectric device modules can further include a fifth thermoelectric device module configured to perform thermal energy harvesting.

In some aspects, the present disclosure describes a plurality of thermoelectric device modules manufactured according to the methods described herein. In some aspects, the plurality of thermoelectric device modules may be disposed on a substrate, such as a carrier wafer. In some aspects, the plurality of thermoelectric device modules may have been removed (e.g., debonded, exfoliated, or transferred) from the substrate and diced up.

In some aspects, the present disclosure describes an apparatus. The apparatus can include a substrate and thermoelectric device modules disposed on the substrate. Each of the thermoelectric device modules can include a first thermoelectric structure disposed on the substrate and a second thermoelectric structure disposed on the substrate adjacent to the first thermoelectric structure. Each of the thermoelectric device modules can further include first electrical contacts disposed on a first top surface of the first thermoelectric structure and second electrical contacts disposed on a second top surface of the second thermoelectric structure. Each of the thermoelectric device modules can further include a top header formed over at least one of the first electrical contacts and one of the second electrical contacts.

Example Processes for Thermoelectric Device Fabrication

FIGS. 1A, 1B, 1C, 1D, 1E, 1F, and 1G are schematic illustrations of example process flow steps for fabricating large area scalable TFTEC/TFTEG modules according to some aspects of the present disclosure. For example, the example process flow can begin with individual P-CHESS and N-CHESS epi wafers as described with reference to FIG. 1A and end with large area scalable fabrication TFTEC/TFTEG modules as described with reference to FIG. 1G. Various CHESS structures, materials, and fabrication techniques are described in more detail in U.S. patent application Ser. No. 17/132,640, filed Dec. 23, 2020, and titled "Superlattice Structures for Thermoelectric Devices," U.S. Pat. No. 10,903,139, issued Jan. 26, 2021, and titled "Superlattice Structures for Thermoelectric Devices," and U.S. Provisional Patent Application No. 62/420,815, filed Nov. 11, 2016, and titled "Controlled Hierarchical Engineered Superlattice Structures (CHESS) for High-Performance Thin-Film Thermoelectric Devices," each of which is incorporated by reference herein in its entirety. It will be understood that the CHESS layers disclosed herein can be fabricated on any suitable substrate, such as GaAs, silicon (Si), germanium (Ge), sapphire, etc. In some aspects, the CHESS layers disclosed herein can be grown on GaAs wafers and then transferred to a carrier wafer, where the GaAs can be selectively etched, leaving the thermoelectric films intact. As a result, GaAs may not be present in the final thermoelectric device module.

In some aspects, the example process flow can be used to fabricate any range of TFTEC or TFTEG modules from the large area scalable fabrication array, such as 2-couple to 4-couple to 8-couple modules (and larger arrays), and dice them out for multiple uses. In some aspects, the area of photolithographic contact size for the P-CHESS and N-CHESS elements can determine the properties of the P-N couple, such as its cooling capacity or power generation capacity. It is to be understood that the structures shown in FIGS. 1A, 1B, 1C, 1D, 1E, 1F, and 1G are not drawn to scale.

FIG. 1A illustrates P-CHESS and N-CHESS epi growth on separate substrates (e.g., GaAs wafers, Si wafers, Ge wafers, sapphire wafers, etc.). As shown in FIG. 1A, step 100 of the example process flow can include forming (e.g., growing) a P-CHESS layer 120 on a GaAs substrate 122. In some aspects, the P-CHESS layer 120 can be patterned to form P-CHESS islands to aid in the dicing of the P-CHESS layer 120 into p-type thermoelectric structures (e.g., rectangular strips). Step 100 can further include forming an N-CHESS layer 130 on a GaAs substrate 132. In some aspects, the N-CHESS layer 130 can be patterned to form N-CHESS islands to aid in the dicing of the N-CHESS layer 130 into n-type thermoelectric structures (e.g., rectangular strips).

Figure 1B:
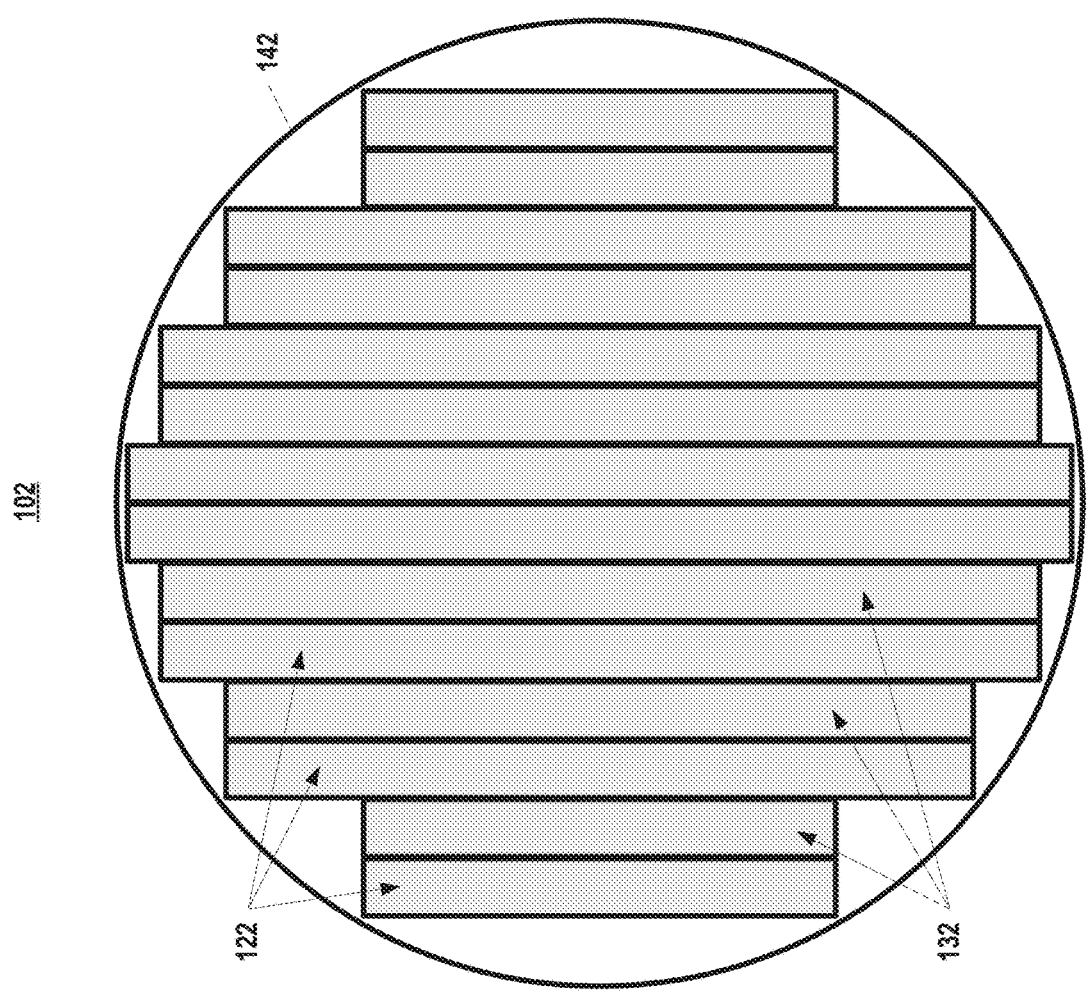
Figure 1B:
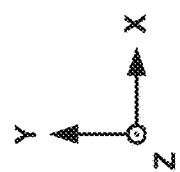

FIG. 1B illustrates wafer-level strip bonding of P-CHESS and N-CHESS thermoelectric structures to a carrier wafer (e.g., a 10 inch Si or MN carrier wafer on which hundreds of P-CHESS and N-CHESS epi strips can be bonded). As shown in FIG. 1B, step 102 of the example process flow can include dicing the P-CHESS layer 120 disposed on the GaAs substrate 122 into p-type thermoelectric structures, flipping them upside down, and disposing (e.g., bonding) the P-CHESS layer 120 of each of the p-type thermoelectric structures to a carrier wafer 142. Step 102 can further include dicing the N-CHESS layer 130 disposed on the GaAs substrate 132 into n-type thermoelectric structures, flipping them upside down, and disposing (e.g., bonding) the N-CHESS layer 130 of each of the n-type thermoelectric structures to the carrier wafer 142 adjacent to the p-type thermoelectric structures.

Figure 1C:
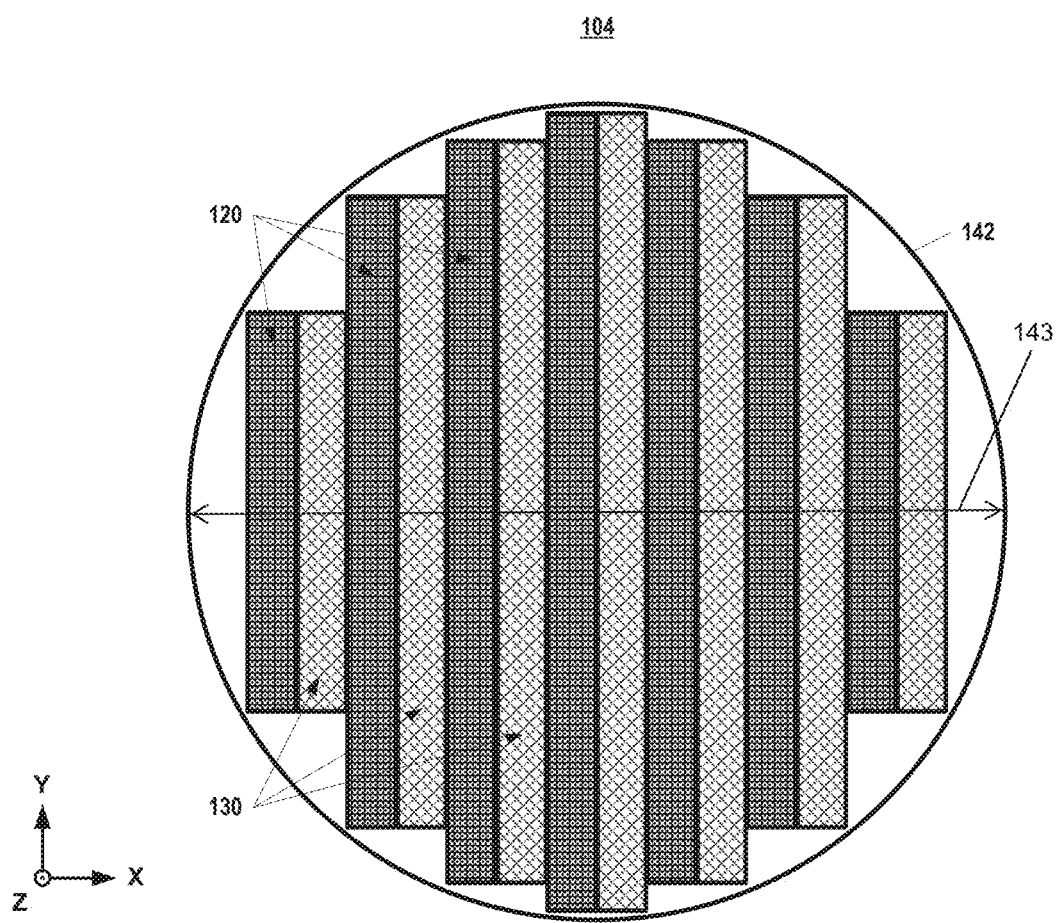

FIG. 1C illustrates wafer-level substrate etching to remove the substrate material (e.g., GaAs) from the n-type and p-type thermoelectric structures. As shown in FIG. 1C, step 104 of the example process flow can include removing the GaAs substrate 122 from each of the p-type thermoelectric structures, leaving the P-CHESS layer 120 of each of the p-type thermoelectric structures exposed for further processing. Step 104 can further include removing the GaAs substrate 132 from each of the n-type thermoelectric structures, leaving the N-CHESS layer 130 of each of the n-type thermoelectric structures exposed for further processing.

Figure 1D:
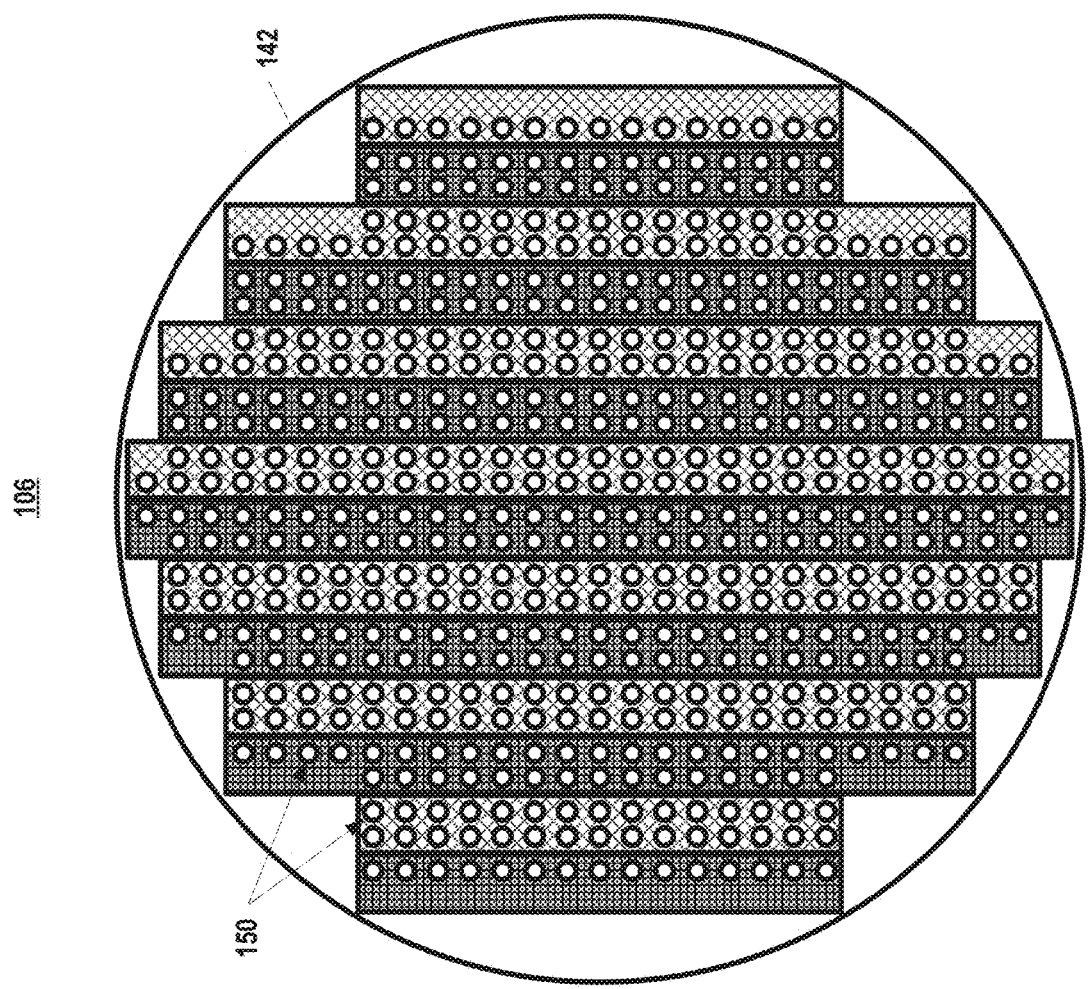

FIG. 1D illustrates wafer-level photolithography to prepare for metallization and the formation of electrical contacts. As shown in FIG. 1D, step 106 of the example process flow can include performing photolithographic operations (e.g., photoresist patterning, etc.) to form openings 150 for electrical contacts.

Figure 1E:
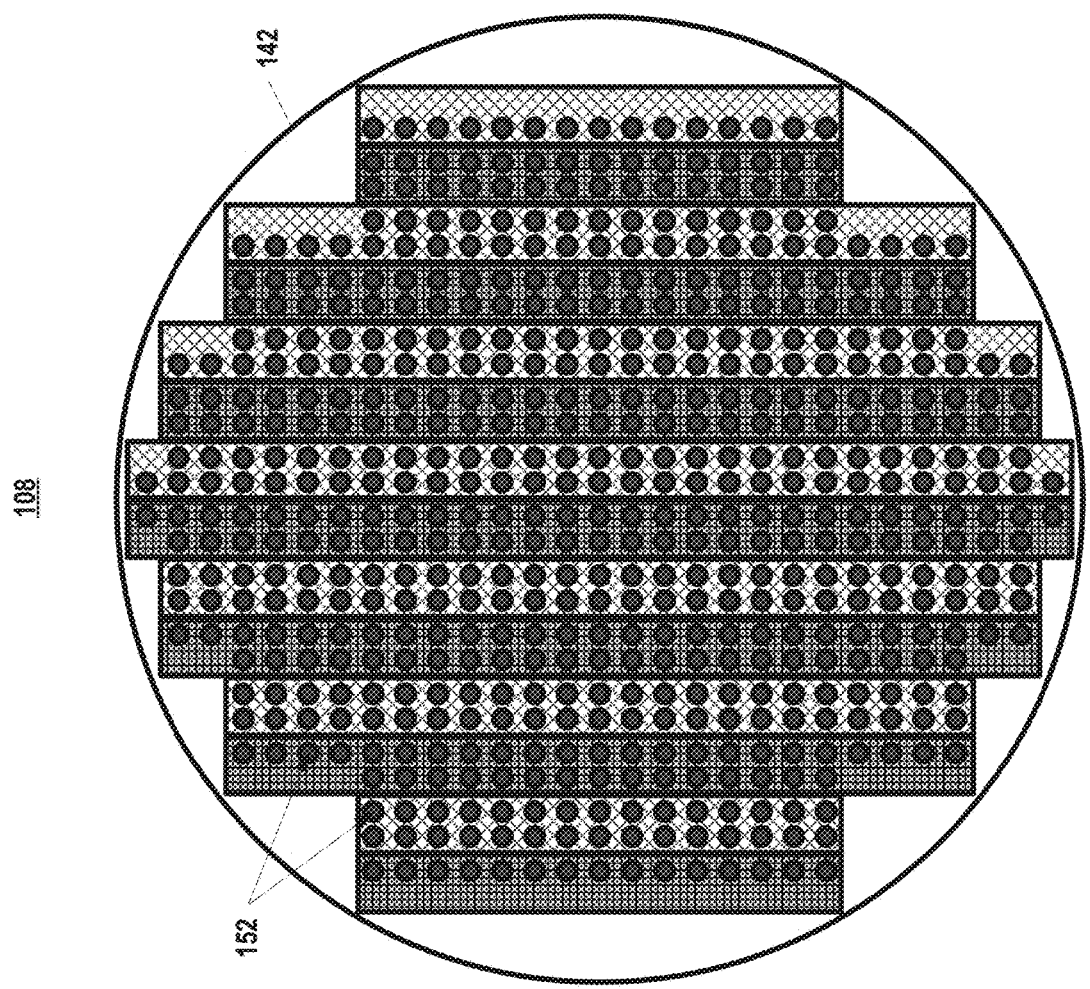

FIG. 1E illustrates wafer-level plating metallization to form electrical contacts on the surfaces of the p-type and n-type thermoelectric structures. As shown in FIG. 1E, step 108 of the example process flow can include forming electrical contacts 152 on a top surface of each respective one of the p-type and n-type thermoelectric structures.

Figure 1F:
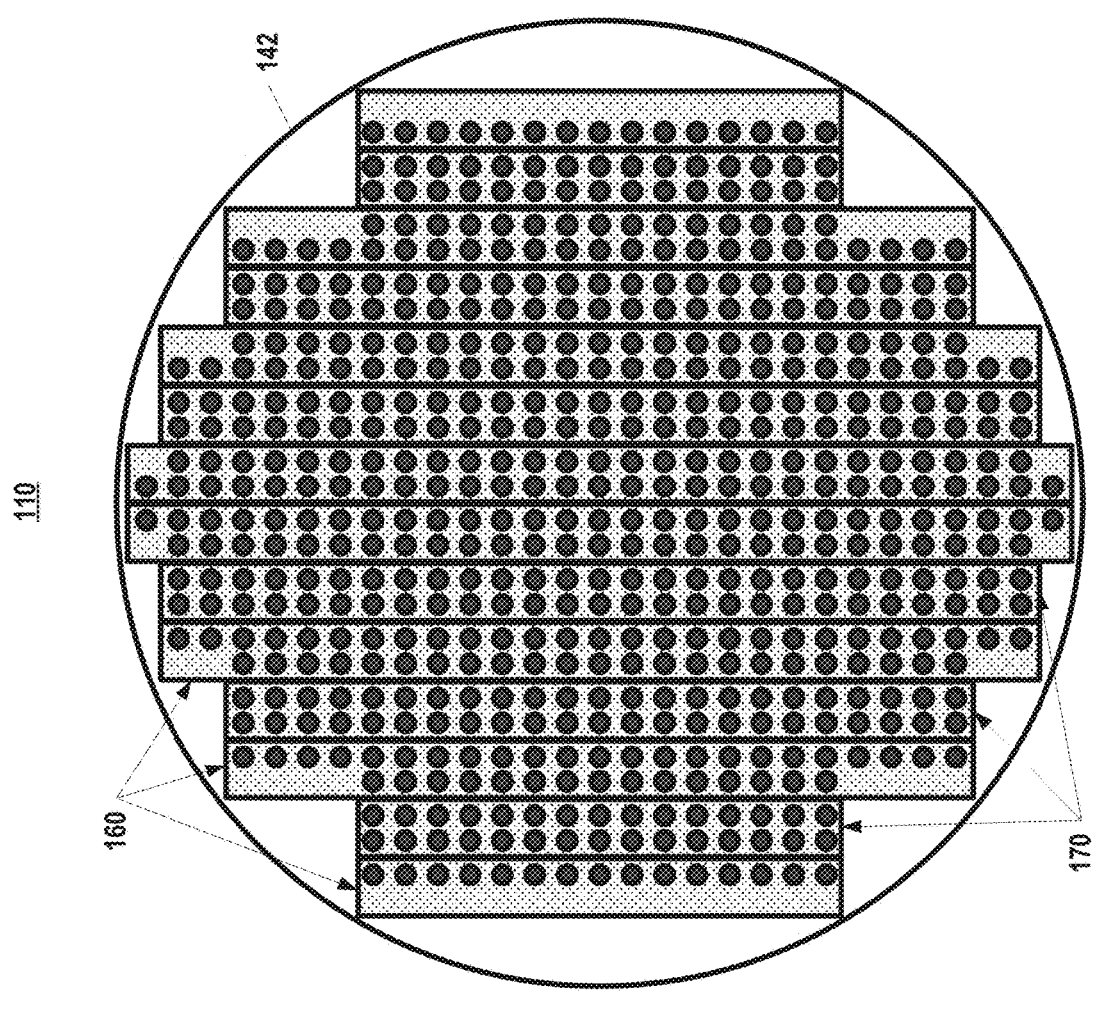

FIG. 1F illustrates wafer-level isolation of the p-type and n-type thermoelectric structures. As shown in FIG. 1F, step 110 of the example process flow can include isolating the p-type and n-type thermoelectric structures to form isolated p-type thermoelectric structures 160 and isolated n-type thermoelectric structures 170.

Figure 1G:
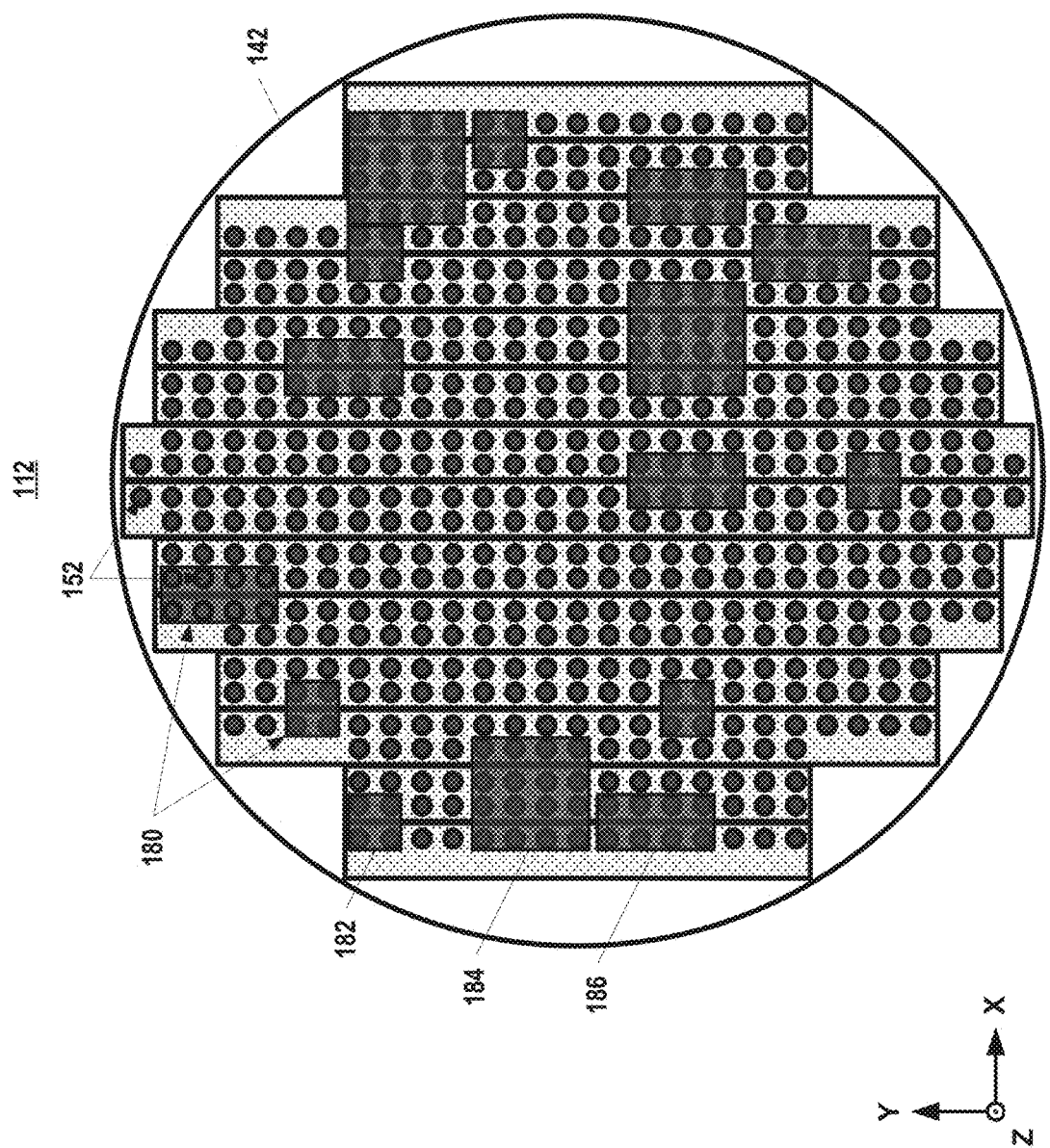

FIG. 1G illustrates wafer-level application-agnostic thermoelectric device fabrication. As shown in FIG. 1G, step 112 of the example process flow can include forming top headers 180 over subsets of the electrical contacts 152 to form thermoelectric device modules. For example, top header 182 includes a common header for 2 P-N couples, top header 184 includes a common header for 8 P-N couples, and top header 186 includes a common header for 4 P-N couples. In some aspects, different thermoelectric device modules can be configured to perform different functionalities in different applications based on the geometries and amounts of their respective electrical contacts 152 and top headers 180. For example, a first thermoelectric device module can be configured to perform electronics cooling, a second thermoelectric device module can be configured to perform refrigeration, a third thermoelectric device module can be configured to perform air conditioning, a fourth thermoelectric device module can be configured to perform thermal control, and a fifth thermoelectric device module can be configured to perform thermal energy harvesting. Subsequently, the thermoelectric device modules can be diced up for use in their respective applications.

FIGS. 2-8 are schematic illustrations of example process flow steps for fabricating large area scalable TFTEC/TFTEG modules according to some aspects of the present disclosure. For example, FIGS. 2-8 illustrate example process flow steps for growing P-CHESS and N-CHESS epi on 2 inch to 6 inch GaAs wafers and performing TFTEC/TFTEG device fabrication using large-area versatile large area processing on an 8 in to 12 in carrier wafer (also referred to as a "handle wafer") to scale up the production volume of P-N couples and thereby reduce per-unit production cost and time. The example process flow described with reference to FIGS. 2-8 can significantly reduce the burden of scaling-up epitaxial growth because P-CHESS and N-CHESS epi can be grown in 2 in by 2 in areas and still be processed, for device fabrication, at volume scale on 8 in, 10 in, and 12 in handle wafers, thereby achieving lower P-N couple costs and manufacturing times. It is to be understood that the structures shown in FIGS. 2-8 are not drawn to scale.

Figure 2:
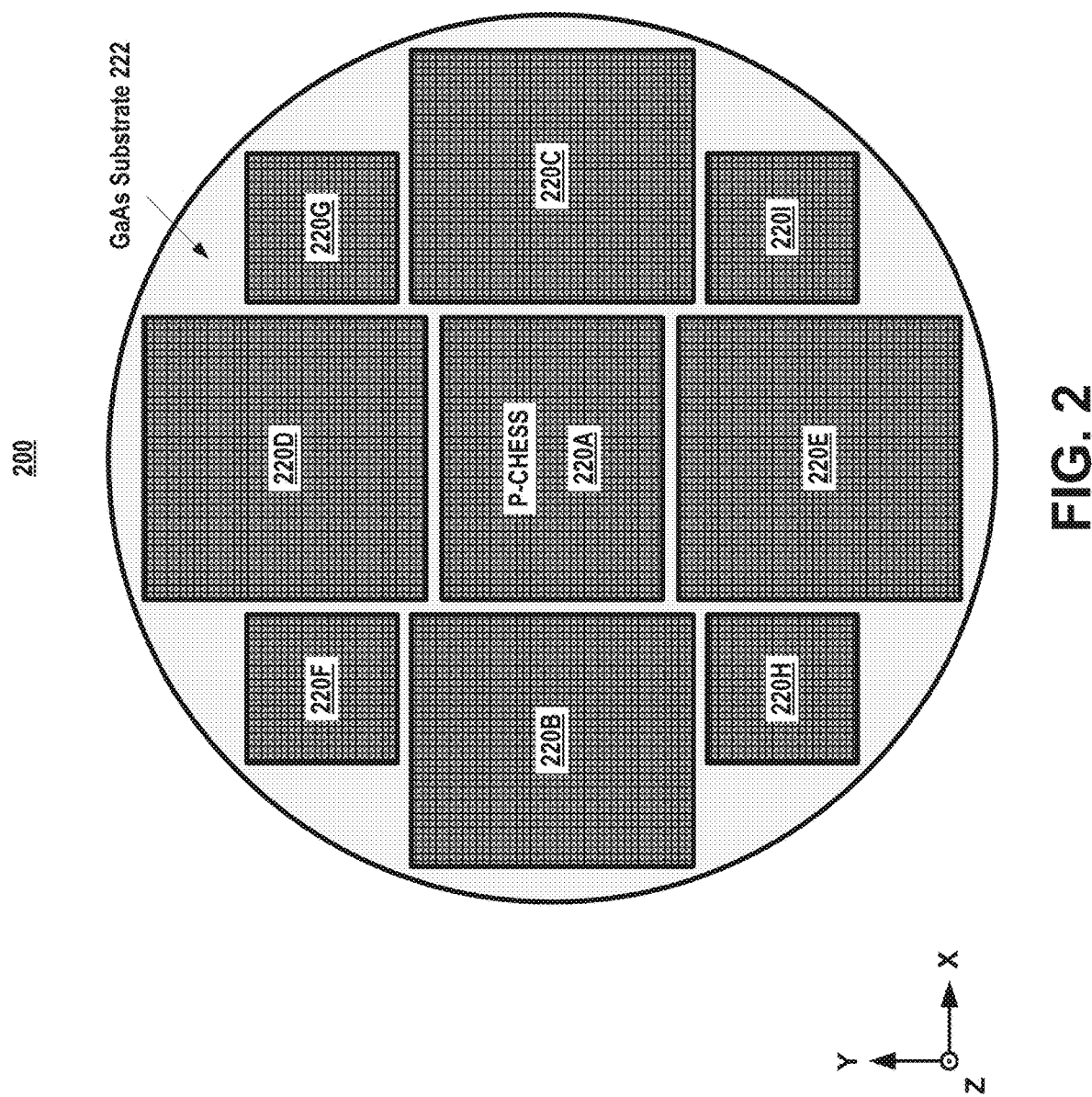
FIG. 2 is a schematic illustration of P-CHESS epitaxial (epi) growth on a gallium arsenide (GaAs) wafer according to some aspects of the present disclosure.

FIG. 2 illustrates a top view 200 showing P-CHESS epi growth on a GaAs wafer. As shown in FIG. 2, P-CHESS areas 220A-220I can be grown on a GaAs substrate 222 (e.g., a 6 inch GaAs wafer). P-CHESS area 220A can have an area of about 2.0 inches along the X-axis by about 1.6 inches along the Y-axis. P-CHESS areas 220B and 220C can each have an area of about 2.0 inches along the Y-axis by about 1.8 inches along the X-axis. P-CHESS areas 220D and 220E can each have an area of about 2.0 inches along the X-axis by about 2.0 inches along the Y-axis. P-CHESS areas 220F, 220G, 220H, and 220I can each have an area of about 1.0 inches along the X-axis by about 1.25 inches along the Y-axis. Each of the P-CHESS areas 220A-220I can be diced up into p-type thermoelectric structures (e.g., rectangular strips), which can be assembled onto a handle wafer. In this example, the effective P-CHESS epi area available to be processed as strips is about 150 square centimeters (cm$^2$). In some aspects, each of the P-CHESS areas 220A-220I can be patterned to include P-CHESS islands to aid in the dicing of each of the P-CHESS areas 220A-220I into p-type thermoelectric structures (e.g., about 2.0 inches by about 0.1 to 0.3 mm rectangular P-CHESS strips). For example, each P-CHESS island can be about 2.0 inches long along the Y-axis by about 0.1 to 0.3 mm wide along the X-axis by about 20 to 25 microns thick along the Z-axis and can be separated from adjacent islands by about 100 microns to aid in dicing.

Figure 3:
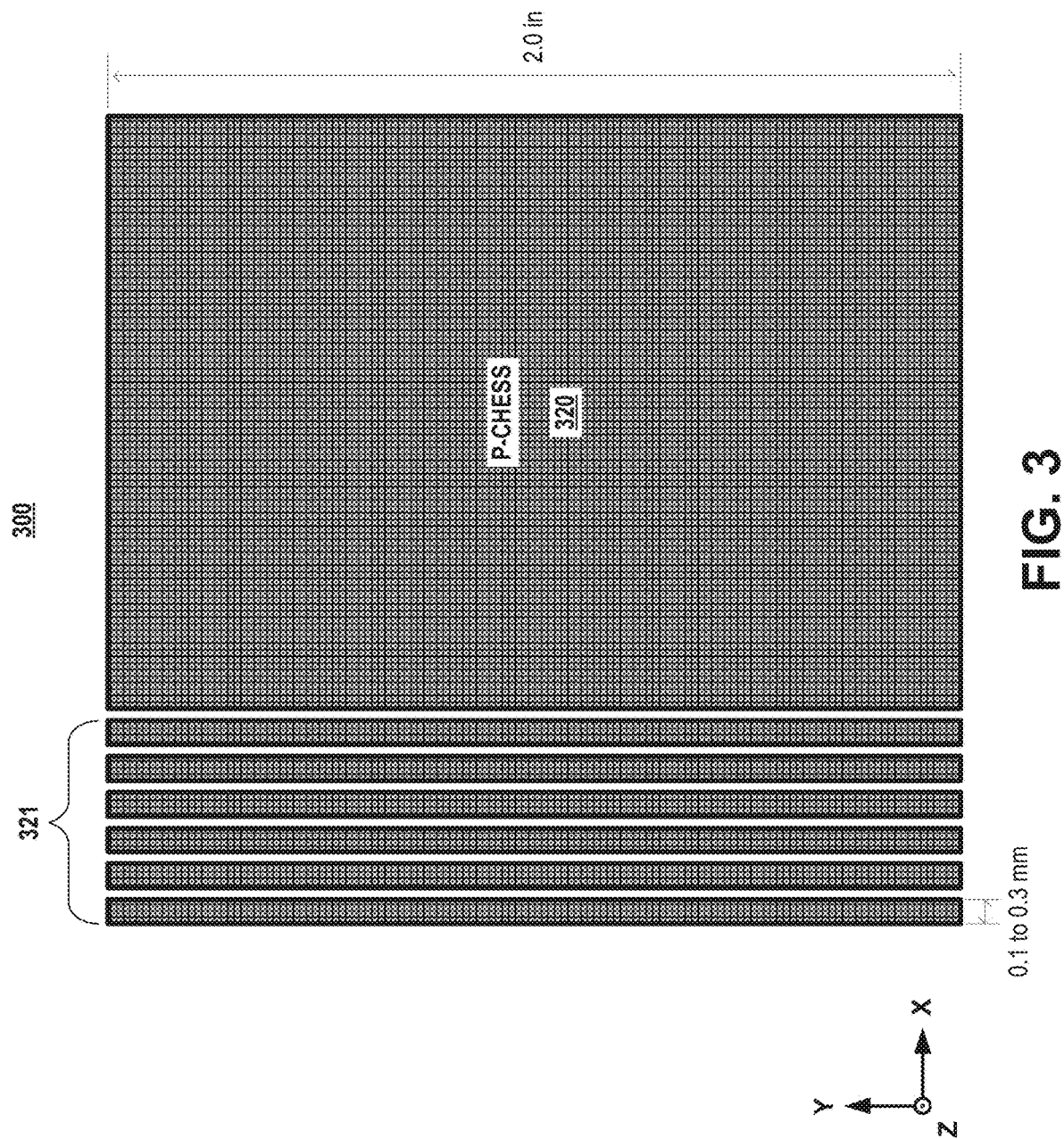
FIG. 3 is a schematic illustration of the dicing up of an example P-CHESS die into p-type thermoelectric structures according to some aspects of the present disclosure.

FIG. 3 illustrates a top view 300 showing the dicing up of an example P-CHESS die 320 (e.g., P-CHESS area 220B disposed on GaAs substrate 222 that has been diced into a separate die) into p-type thermoelectric structures 321. Each of the p-type thermoelectric structures 321 can be a strip having rectangular dimensions of about 2.0 inches long along the Y-axis by about 0.1 to 0.3 mm wide (e.g., on average about 0.2 mm wide) along the X-axis and a thickness of about 20 to 25 microns along the Z-axis (not including the thickness of the GaAs substrate on which the P-CHESS material is disposed).

Figure 4:
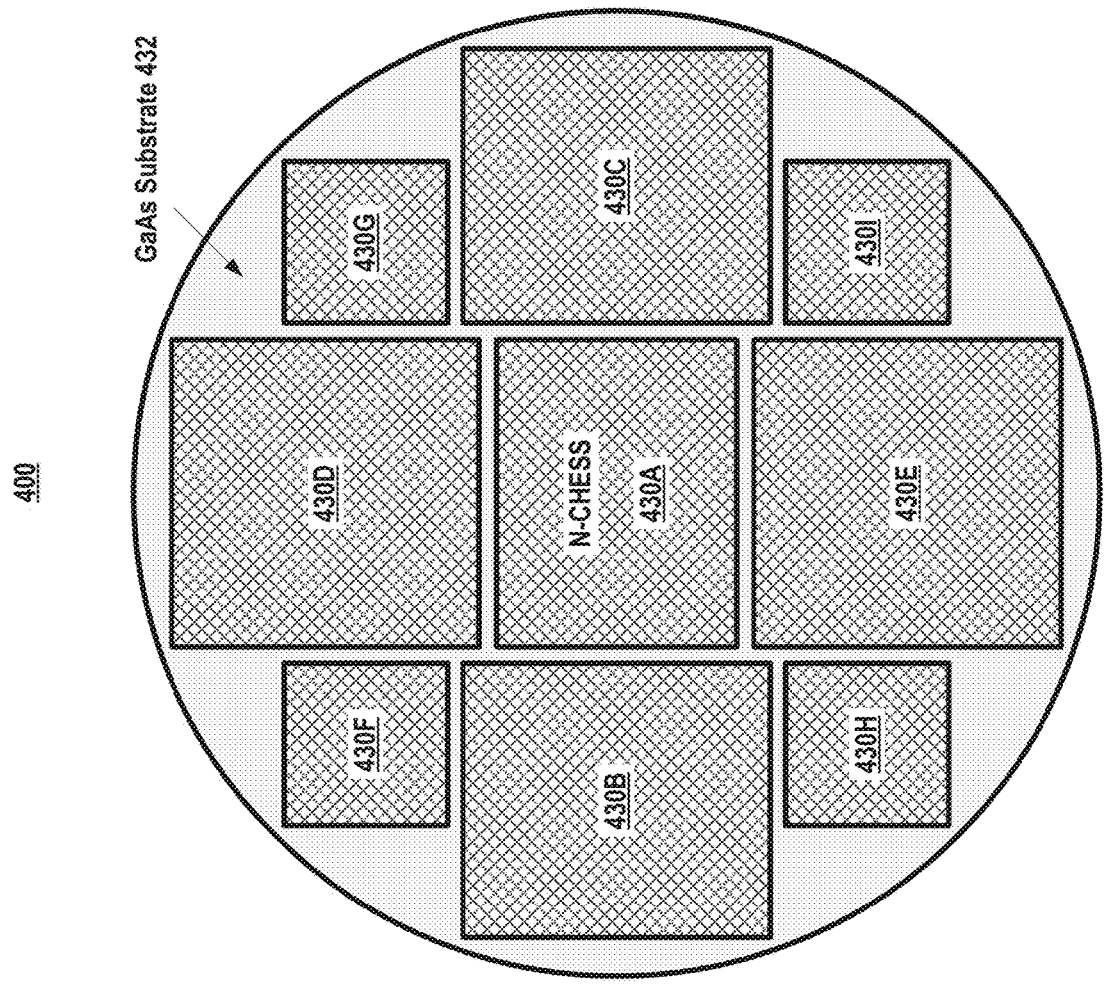
FIG. 4 is a schematic illustration of N-CHESS epi growth on a GaAs wafer according to some aspects of the present disclosure.

FIG. 4 illustrates a top view 400 showing N-CHESS epi growth on a GaAs wafer. As shown in FIG. 4, N-CHESS areas 430A-430I can be grown on a GaAs substrate 232 (e.g., a 6 inch GaAs wafer). N-CHESS area 430A can have an area of about 2.0 inches along the X-axis by about 1.6 inches along the Y-axis. N-CHESS areas 430B and 430C can each have an area of about 2.0 inches along the Y-axis by about 1.8 inches along the X-axis. N-CHESS areas 430D and 430E can each have an area of about 2.0 inches along the X-axis by about 2.0 inches along the Y-axis. N-CHESS areas 430F, 430G, 430H, and 430I can each have an area of about 1.0 inches along the X-axis by about 1.25 inches along the Y-axis. Each of the N-CHESS areas 430A-430I can be diced up into n-type thermoelectric structures (e.g., rectangular strips), which can be assembled onto a handle wafer. In this example, the effective N-CHESS epi area available to be processed as strips is about 150 cm$^2$. In some aspects, each of the N-CHESS areas 430A-430I can be patterned to include N-CHESS islands to aid in the dicing of each of the N-CHESS areas 430A-430I into n-type thermoelectric structures (e.g., about 2.0 inches by about 0.1 to 0.3 mm rectangular N-CHESS strips). For example, each N-CHESS island can be about 2.0 inches long along the Y-axis by about 0.1 to 0.3 mm wide along the X-axis by about 20 to 25 microns thick along the Z-axis and can be separated from adjacent islands by in-plane distances sufficient to aid in dicing.

Figure 5:
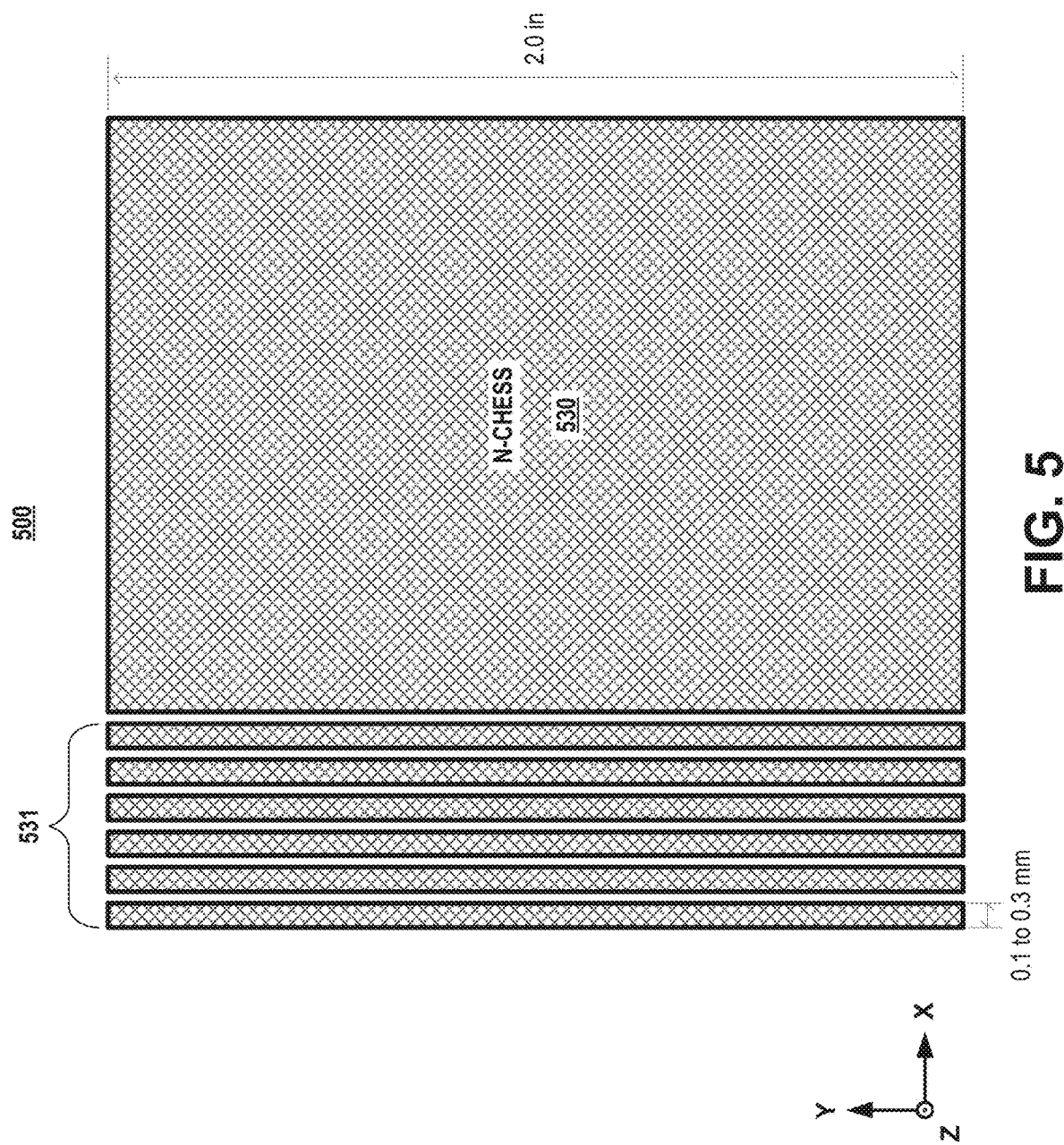
FIG. 5 is a schematic illustration of the dicing up of an example N-CHESS die into n-type thermoelectric structures according to some aspects of the present disclosure.

FIG. 5 illustrates a top view 500 showing the dicing up of an example N-CHESS die 530 (e.g., N-CHESS area 430B disposed on GaAs substrate 432 that has been diced into a separate die) into n-type thermoelectric structures 531. Each of the n-type thermoelectric structures 531 can be a strip having rectangular dimensions of about 2.0 inches long along the Y-axis by about 0.1 to 0.3 mm wide (e.g., on average about 0.2 mm wide) along the X-axis and a thickness of about 20 to 25 microns along the Z-axis (not including the thickness of the GaAs substrate on which the N-CHESS material is disposed).

Figure 6:
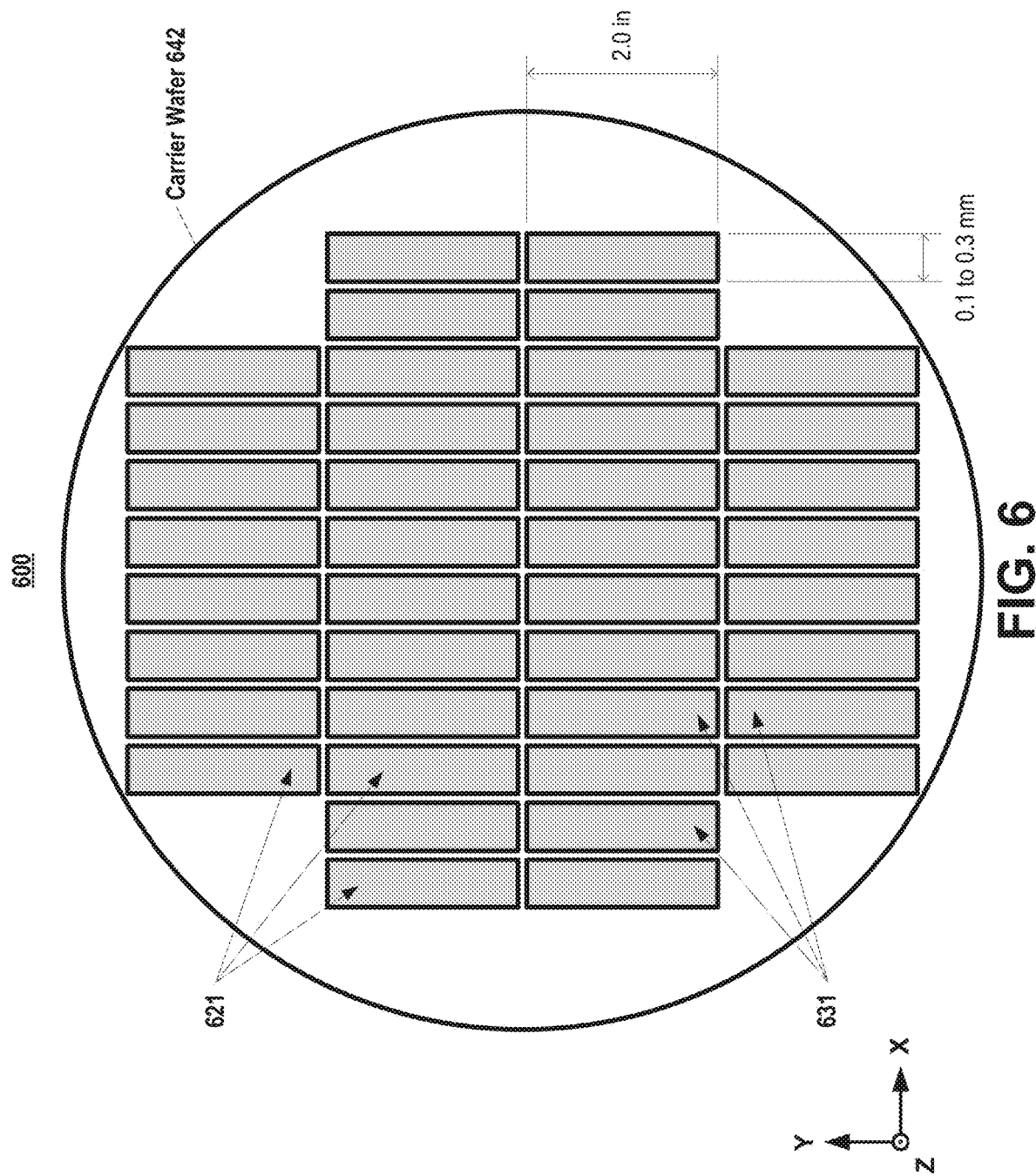
FIG. 6 is a schematic illustration of the assembly of alternating p-type and n-type thermoelectric structures onto a carrier wafer according to some aspects of the present disclosure.

FIG. 6 illustrates a top view 600 showing the assembly of alternating p-type thermoelectric structures 621 and n-type thermoelectric structures 631 onto a carrier wafer 642. The carrier wafer 642 can be, for example, a 10 inch Si or MN carrier wafer onto which four rows of hundreds of 2.0 inches by 0.1 to 0.3 mm rectangular P-CHESS and N-CHESS epi strips can be bonded. The alternating p-type thermoelectric structures 621 and n-type thermoelectric structures 631 can be bonded onto the carrier wafer 642 by flipping them upside down and bonding them to the carrier wafer 642 such that their GaAs substrates are on top. As a result, the N-CHESS layer of each of the n-type thermoelectric structures 631 can be bonded to the carrier wafer 642 adjacent to the P-CHESS layer of each of the p-type thermoelectric structures 621.

Figure 7:
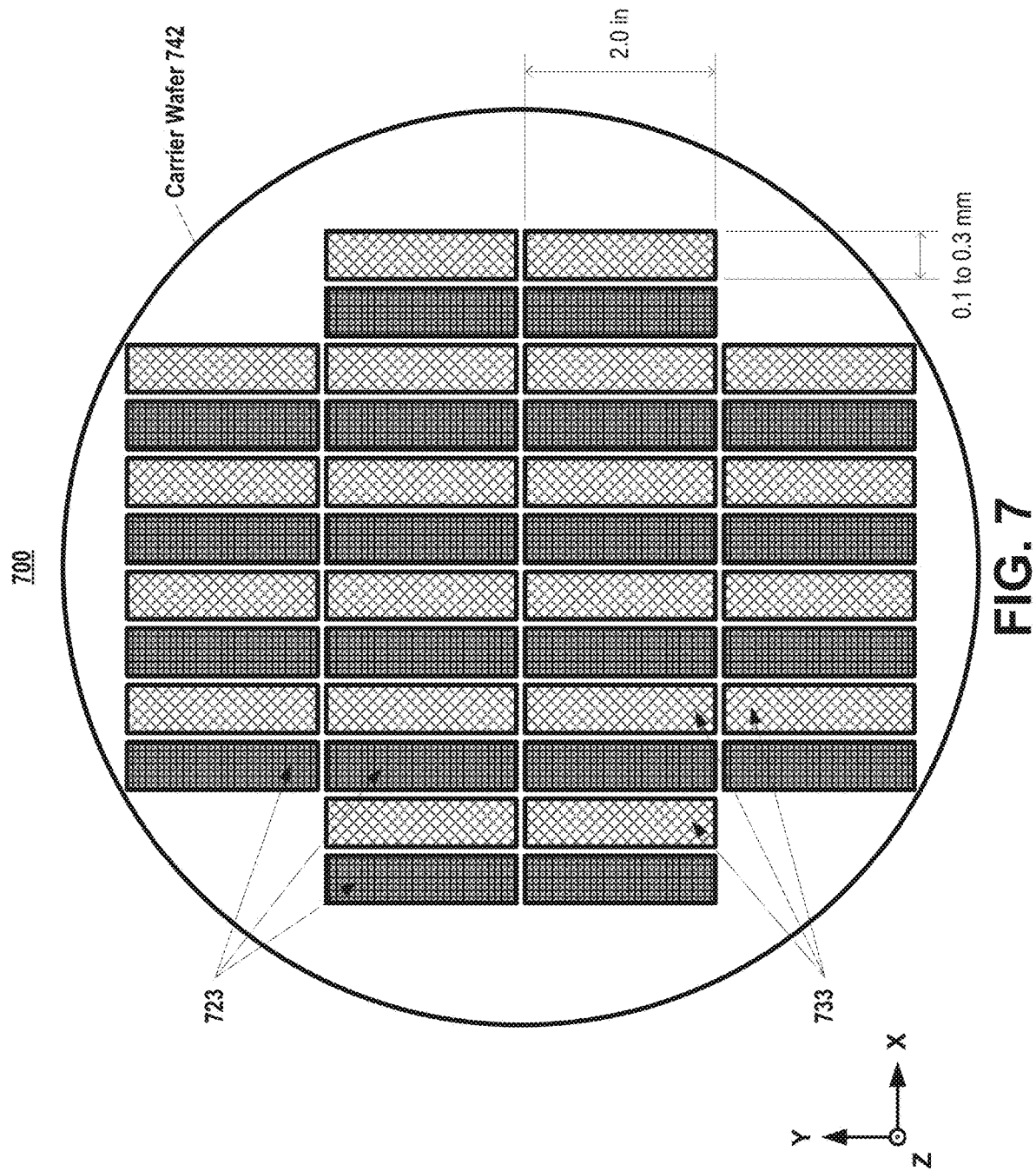
FIG. 7 is a schematic illustration of the removal of GaAs substrate material from alternating p-type and n-type thermoelectric structures bonded to a carrier wafer according to some aspects of the present disclosure.

FIG. 7 illustrates a top view 700 showing alternating p-type thermoelectric structures 723 and n-type thermoelectric structures 733 bonded onto a carrier wafer 742 after selectively removing of their GaAs substrates, exposing the P-CHESS and N-CHESS epi sides to make a variety of electrical contacts.

Figure 8:
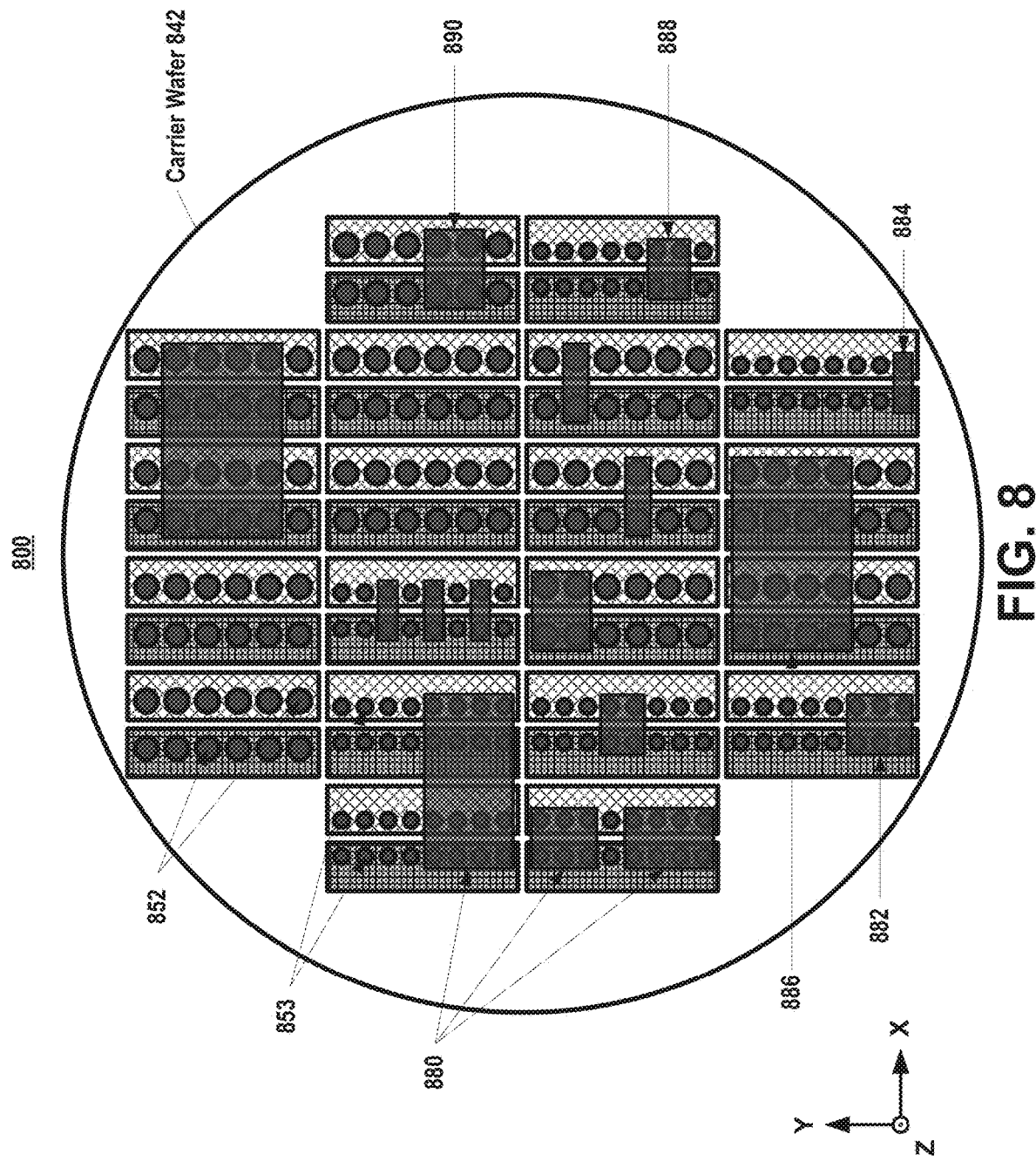
FIG. 8 is a schematic illustration of the formation of electrical contacts and top headers onto alternating p-type and n-type thermoelectric structures bonded to a carrier wafer to form a variety of thermoelectric device modules according to some aspects of the present disclosure.

FIG. 8 illustrates a top view 800 showing alternating p-type thermoelectric structures and n-type thermoelectric structures bonded onto a carrier wafer 842 after forming a variety of electrical contacts, such as electrical contacts 852 and electrical contacts 853, on a top surface of each respective one of the p-type and n-type thermoelectric structures. The electrical contacts can be formed by photolithographic operations and metallization, such as evaporation followed by electroplating or electroplating fully. The electrical contacts can be applied across the various areas to form CHESS P-N couples in a large area with variable and ad hoc designs. For example, each of the electrical contacts 852 (e.g., about 250 microns in diameter) can have a larger contact area than, but the same thickness as, each of the electrical contacts 853 (e.g., about 35 to 50 microns in diameter). As a result, the electrical contacts 852 and the electrical contacts 853 can drive different currents with the same thickness (e.g., about 15 to 30 microns) but different aspect ratios.

In some aspects, both the P-CHESS and N-CHESS epi surfaces can be prepared for surface cleanliness so that the photoresist patterning and developing does not substantially affect the quality of the electrical contacts. The electrical contacts can be in the form of metal posts that are anywhere between 25 to 50 microns thick. The P and N device elements can be checked for thermoelectric figure of merit ZT, and the P-N couple ZT can also be checked.

In some aspects, top headers 880 can be formed over subsets of the electrical contacts 852, the electrical contacts 853, or both to form thermoelectric device modules, from a single P-N couple to a multiple arrays of P-N couples. For example, top header 882 can be formed over six of the smaller electrical contacts 853 and include a common header for three P-N couples. For the three P-N couple pair, the top header 884 can be designed to form the three P-N couples electrically in series and electrically in parallel. In another example, top header 884 can be formed over two of the smaller electrical contacts 853 and include a common header for a single P-N couple. In yet another example, top header 886 can be formed over sixteen of the larger electrical contacts 852 and include a common header for eight P-N couples. In yet another example, top header 888 can be formed over four of the smaller electrical contacts 853 and include a common header for two P-N couples. In yet another example, top header 890 can be formed over four of the larger electrical contacts 852 and include a common header for two P-N couples.

In some aspects, the different thermoelectric device modules can be configured to perform different functionalities in different applications based on the geometries and amounts of their respective electrical contacts 852, the electrical contacts 853, and the top headers 880. Subsequently, the various thermoelectric device modules or sub-units can be diced out for use in their respective applications as described in greater detail with reference to FIG. 9.

Figure 9:
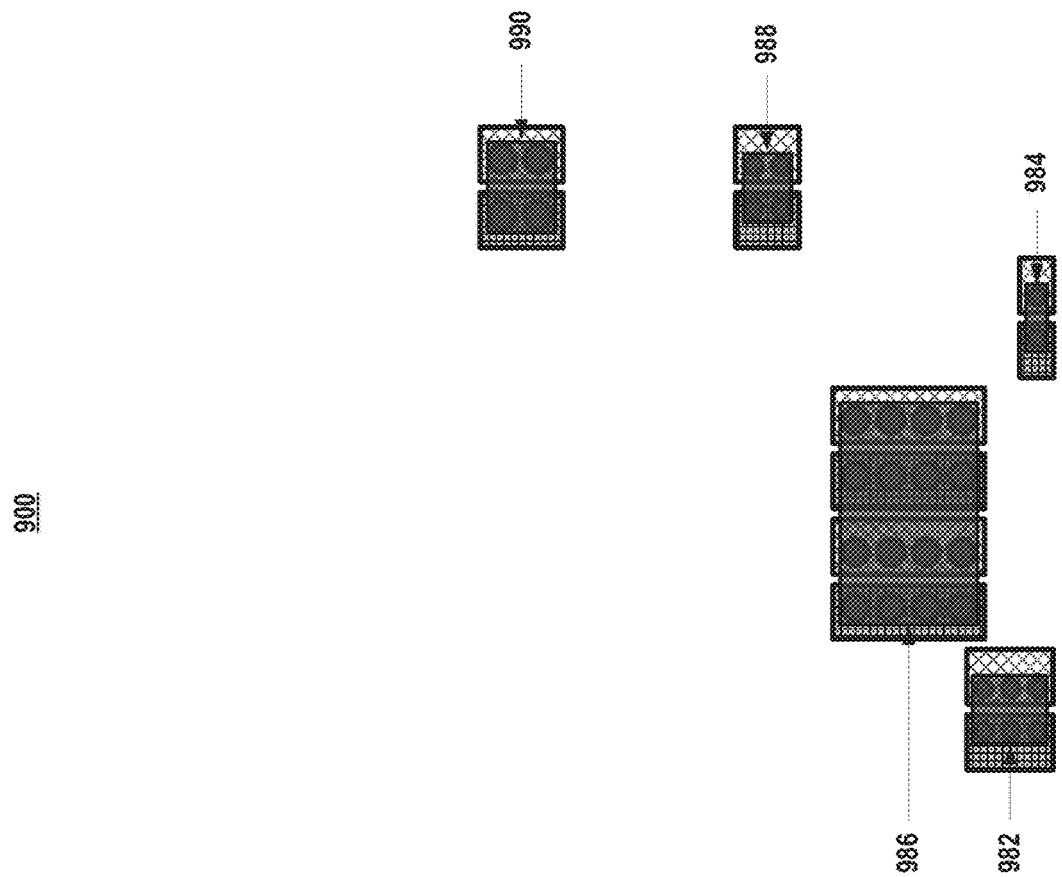
FIG. 9 is a schematic illustration of the dicing out of various thermoelectric device modules for use in their respective applications, according to some embodiments.

FIG. 9 illustrates a top view 900 showing thermoelectric device modules 982, 984, 986, 988, and 990 that have been diced up for use in their respective applications, according to some embodiments. In some aspects, each of the thermoelectric device modules 982, 984, 986, 988, and 990 can be configured to perform a different functionality in a different application based on the geometries and amounts of their respective electrical contacts and top headers.

For example, the thermoelectric device module 982 can be configured to perform electronics cooling. To do so, the thermoelectric device module 982 can include a top header disposed over six smaller electrical contacts, forming a common header for three P-N couples.

In another example, the thermoelectric device module 984 can be configured to perform refrigeration. To do so, the thermoelectric device module 984 can include a top header disposed over two smaller electrical contacts, forming a common header for a single P-N couple.

In yet another example, the thermoelectric device module 986 can be configured to perform air conditioning. To do so, the thermoelectric device module 986 can include a top header disposed over sixteen larger electrical contacts, forming a common header for eight P-N couples.

In yet another example, the thermoelectric device module 988 can be configured to perform thermal control. To do so, the thermoelectric device module 988 can include a top header disposed over four smaller electrical contacts, forming a common header for two P-N couples.

In yet another example, the thermoelectric device module 990 can be configured to perform thermal energy harvesting. To do so, the thermoelectric device module 990 can include a top header disposed over four larger electrical contacts, forming a common header for two P-N couples.

Example Processes for Manufacturing Thermoelectric Device Modules

Figure 10:
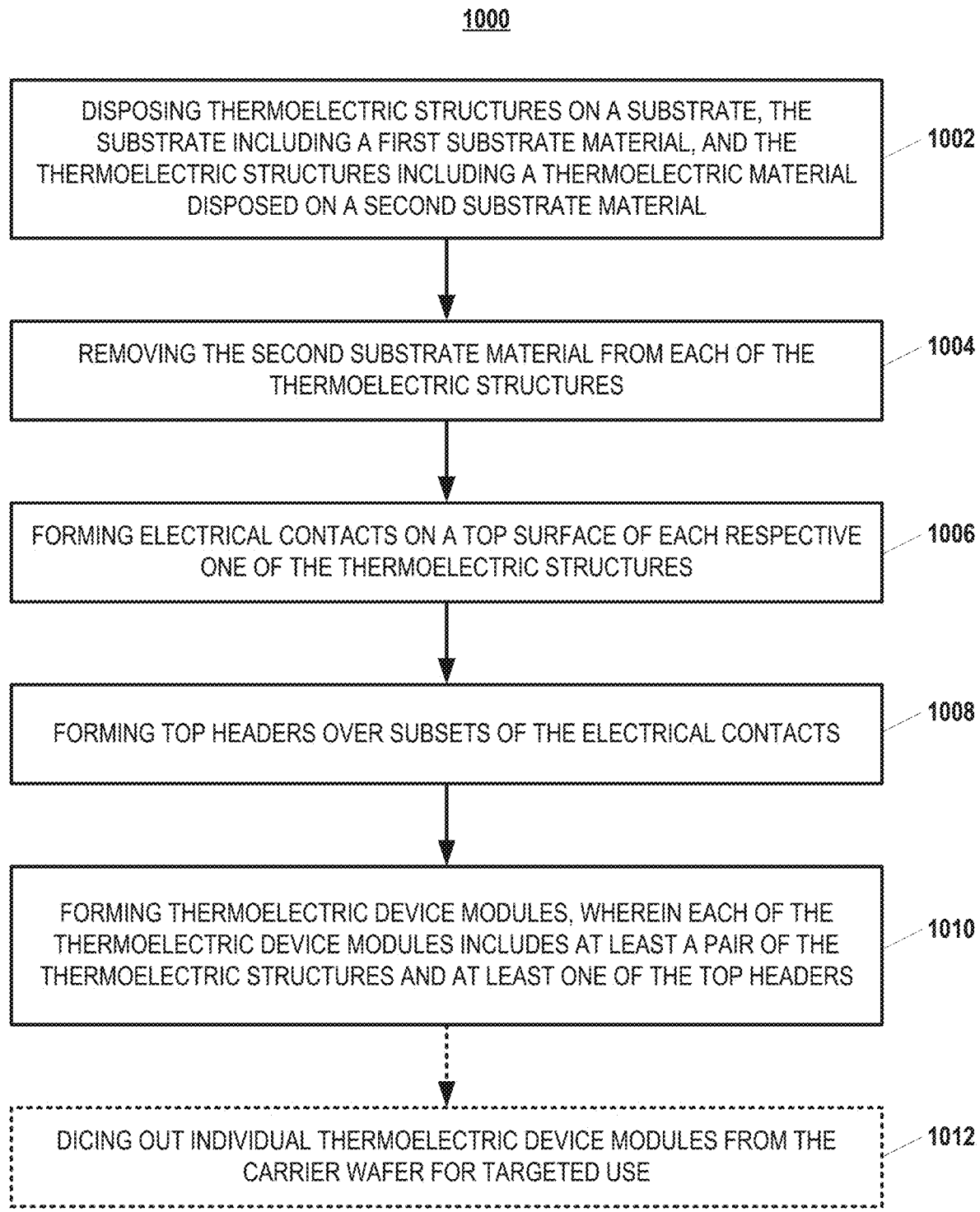
FIG. 10 is an example method for manufacturing thermoelectric device modules according to some aspects of the present disclosure or portion(s) thereof.

FIG. 10 is an example method 1000 for manufacturing thermoelectric device modules according to some aspects of the present disclosure or portion(s) thereof. In some aspects, method 1000 can provide for large area scalable fabrication of versatile thin-film thermoelectric device modules as described herein. The operations described with reference to example method 1000 can be performed by, or according to, any of the systems, apparatuses, components, techniques, or combinations thereof described herein, such as those described with reference to FIGS. 1-9 above.

At operation 1002, the method 1000 can include disposing thermoelectric structures (e.g., p-type thermoelectric structures 321, 621; p-type thermoelectric structures including the P-CHESS layer 120 disposed on the GaAs substrate 122; n-type thermoelectric structures 531, 631; n-type thermoelectric structures including the N-CHESS layer 130 disposed on the GaAs substrate 132) on a substrate (e.g., carrier wafer 142, 642, 742). The substrate can include a first substrate material (e.g., glass, SiC, AlN, $Al_2O_3$, Si, or a flexible material such as Kapton™). Each of the thermoelectric structures can include a CHESS material (e.g., P-CHESS layer 120, N-CHESS layer 130, P-CHESS areas 220A-220I, N-CHESS areas 430A-430I) disposed on a second substrate material (e.g., GaAs substrate 122, 132, 222, 432; a Si, Ge, or sapphire wafer).

In some aspects, the thermoelectric structures can include P-CHESS structures (e.g., p-type thermoelectric structures 321, 621) and N-CHESS structures (e.g., n-type thermoelectric structures 531, 631), where a pair of thermoelectric structures includes one of the P-CHESS structures and one of the N-CHESS structures. In some aspects, each of the P-CHESS structures can include a P-CHESS material, and each of the N-CHESS structures can include an N-CHESS material.

In some aspects, each of the P-CHESS structures can include a first CHESS material including first CHESS periods, where each of the first CHESS periods includes a first p-type semiconductor material layer disposed adjacent to a second p-type semiconductor material layer. In one example, for each of the first CHESS periods, the first p-type semiconductor material layer can include p-type $Bi_2Te_3$, and the second p-type semiconductor material layer can include p-type $Sb_2Te_3$ or p-type $Bi_2Te_{3-x}Se_x$. In another example, for each of the first CHESS periods, the first p-type semiconductor material layer can include a first periodic table Group V-VI, II-VI, or IV compound doped to form a second p-type semiconductor material, and the second p-type semiconductor material layer can include a second periodic table Group V-VI, II-VI, or IV compound doped to form a second p-type semiconductor material.

In some aspects, each of the N-CHESS structures can include a second CHESS material including second CHESS periods, where each of the second CHESS periods includes a first n-type semiconductor material layer disposed adjacent to a second n-type semiconductor material layer. In one example, for each of the second CHESS periods, the first n-type semiconductor material layer can include n-type $Bi_2Te_3$, and the second n-type semiconductor material layer can include n-type $Sb_2Te_3$ or n-type $Bi_2Te_{3-x}Se_x$. In another example, for each of the second CHESS periods, the first n-type semiconductor material layer can include a first periodic table Group V-VI, II-VI, or IV compound doped to form a first n-type semiconductor material, and the second n-type semiconductor material layer can include a second periodic table Group V-VI, II-VI, or IV compound doped to form a second n-type semiconductor material.

In some aspects, the disposing of the thermoelectric structures on the substrate at operation 1002 can be accomplished using suitable mechanical or other methods and include disposing the thermoelectric structures on the substrate in accordance with any aspect or combination of aspects described with reference to FIGS. 1-9 above.

At operation 1004, the method 1000 can include removing the second substrate material from each of the thermoelectric structures. In some aspects, the removing of the second substrate material can be accomplished using suitable mechanical or other methods and include removing the second substrate material in accordance with any aspect or combination of aspects described with reference to FIGS. 1-9 above.

At operation 1006, the method 1000 can include forming electrical contacts (e.g., electrical contacts 152, 852, 853) on a top surface of each respective one of the thermoelectric structures. In some aspects, the forming of the electrical contacts can be accomplished using suitable mechanical or other methods and include forming the electrical contacts in accordance with any aspect or combination of aspects described with reference to FIGS. 1-9 above.

At operation 1008, the method 1000 can include forming top headers (e.g., top headers 180, 182, 184, 186, 880, 882, 884) over subsets of the electrical contacts. In some aspects, the forming of the top headers can be accomplished using suitable mechanical or other methods and include forming the top headers in accordance with any aspect or combination of aspects described with reference to FIGS. 1-9 above.

At operation 1010, the method 1000 can include forming thermoelectric device modules (e.g., thermoelectric device modules 982, 984, 986, 988, and 990). Each of the thermoelectric device modules can include at least a pair of the thermoelectric structures and at least one of the top headers. In some aspects, the thermoelectric device modules can include at least one hundred thermoelectric P-N couple device modules and, in some implementations, over one thousand or even one hundred thousand thermoelectric P-N couple device modules. In some aspects, the forming of the thermoelectric device modules can be accomplished using suitable mechanical or other methods and include forming the thermoelectric device modules in accordance with any aspect or combination of aspects described with reference to FIGS. 1-9 above.

Optionally, at optional operation 1012, the method 1000 can include dicing out the individual thermoelectric device modules (e.g., thermoelectric device modules 982, 984, 986, 988, and 990) from the carrier wafer for targeted use. In some aspects, the diced-out thermoelectric device modules can include different types of thermoelectric device modules, such as a first thermoelectric device (e.g., having a first amount of P-N couples and a first sizing of electrical contacts) configured to perform electronics cooling, a second thermoelectric device (e.g., having a second amount of P-N couples and, in some aspects, a second sizing of electrical contacts) configured to perform refrigeration, a third thermoelectric device (e.g., having a third amount of P-N couples and, in some aspects, a third sizing of electrical contacts) configured to perform air conditioning, a fourth thermoelectric device (e.g., having a fourth amount of P-N couples and, in some aspects, a fourth sizing of electrical contacts) configured to perform thermal control, a fifth thermoelectric device (e.g., having a fifth amount of P-N couples and, in some aspects, a fifth sizing of electrical contacts) configured to perform thermal energy harvesting, any other suitable device, or any combination thereof. In some aspects, the dicing out of the thermoelectric device modules can be accomplished using suitable mechanical or other methods and include dicing out the thermoelectric device modules in accordance with any aspect or combination of aspects described with reference to FIGS. 1-9 above.

Optionally, in some aspects, the substrate can be a carrier substrate, and the method 1000 can further include forming the P-CHESS structures on a first substrate (e.g., GaAs substrate 122, 222), dicing the P-CHESS structures, and disposing (e.g., bonding) the P-CHESS structures on the carrier substrate. The method 1000 can further include forming the N-CHESS structures on a second substrate (e.g., GaAs substrate 132, 432), dicing the N-CHESS structures, and disposing (e.g., bonding) the N-CHESS structures on the carrier substrate. In some aspects, the disposing the N-CHESS structures on the carrier substrate can include disposing each of the N-CHESS structures adjacent to one of the P-CHESS structures (e.g., to form an alternating pattern of p-type and n-type thermoelectric structures). In some aspects, a diameter 123 (FIG. 1A) (e.g., 6 in) of the first substrate can be less than a diameter 143 (FIG. 1C) (e.g., 10 in) of the carrier substrate, and a diameter 133 (FIG. 1A) (e.g., 6 in) of the second substrate also can be less than the diameter 143 of the carrier substrate.

Optionally, in some aspects, the forming of the electrical contacts at operation 1006 can include forming a first subset of the electrical contacts (e.g., electrical contacts 852) on a first top surface of each respective one of a first subset of the thermoelectric structures, and forming a second subset of the electrical contacts (e.g., electrical contacts 853) on a second top surface of each respective one of a second subset the thermoelectric structures. In some aspects, a diameter of each of the first subset of the electrical contacts can be different from a diameter of each of the second subset of the electrical contacts. For example, the diameter of each of the first subset of the electrical contacts (e.g., where each electrical contact can be about 250 microns in diameter) can be at least about five times larger than the diameter of each of the second subset of the electrical contacts (e.g., where each electrical contact can be about 35 to 50 microns in diameter). Optionally, in some aspects, the forming of the top headers at operation 1008 can include forming a first top header (e.g., top header 886) over the first subset of the electrical contacts, and forming a second top header (e.g., top header 882, 884) over the second subset of the electrical contacts. In some aspects, a first thickness of the first top header can be about equal to a second thickness of the second top header. In some aspects, a first surface area of the first top header can be different from a second surface area of the second top header.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

What is claimed is:

1. A method comprising:
    disposing a strip of p-type thermoelectric structures and a strip of n-type thermoelectric structures on a substrate made of a first material, wherein the strip of p-type thermoelectric structures comprises p-type thermoelectric material disposed on a first strip made of a second material, and the strip of n-type thermoelectric structures comprises n-type thermoelectric material disposed on a second strip made of the second material;
    removing the second material from the p-type and n-type thermoelectric structures;
    forming electrical contacts on a top surface of each of the strip of p-type thermoelectric structures and the strip of n-type thermoelectric structures;
    forming top headers, wherein the forming of the top headers comprises:

forming a first top header over a first subset of electrical contacts at a portion of the strip of p-type thermoelectric structures and at a corresponding portion of the strip of n-type thermoelectric structures; and forming a second top header separate from the first top header over a second subset of electrical contacts at an other portion of the strip of p-type thermoelectric structures and at a corresponding other portion of the strip of n-type thermoelectric structures; and forming thermoelectric device modules, wherein the forming of the thermoelectric device modules comprises:

forming a first thermoelectric device module at the portion of the strip of p-type thermoelectric structures and at the corresponding portion of the strip of n-type thermoelectric structures; and forming a second thermoelectric device module at the other portion of the strip of p-type thermoelectric structures and at the corresponding other portion of the strip of n-type thermoelectric structures.

2. The method of claim 1, wherein:
the substrate is a carrier wafer; and
the first material comprises one or more of glass, silicon carbide (SiC), aluminum nitride (AlN), alumina ($Al_2O_3$), silicon (Si), or a flexible material.

3. The method of claim 2, wherein:
the p-type thermoelectric structures comprise p-type superlattice structures and the n-type thermoelectric structures comprise n-type superlattice structures.

4. The method of claim 3, wherein each of the p-type superlattice structures comprises a first p-type semiconductor material layer disposed adjacent to a second p-type semiconductor material layer.

5. The method of claim 4, wherein:
the first p-type semiconductor material layer comprises p-type bismuth telluride ($Bi_2Te_3$); and
the second p-type semiconductor material layer comprises p-type antimony telluride ($Sb_2Te_3$) or a p-type bismuth selenide alloy ($Bi_2Te_{3-x}Se_x$).

6. The method of claim 4, wherein:
the first p-type semiconductor material layer comprises a first periodic table Group V-VI, II-VI, or IV compound doped to form a first p-type semiconductor material; and
the second p-type semiconductor material layer comprises a second periodic table Group V-VI, II-VI, or IV compound doped to form a second p-type semiconductor material.

7. The method of claim 3, wherein each of the n-type superlattice structures comprises a first n-type semiconductor material layer disposed adjacent to a second n-type semiconductor material layer.

8. The method of claim 7, wherein:
the first n-type semiconductor material layer comprises n-type bismuth telluride ($Bi_2Te_3$); and
the second n-type semiconductor material layer comprises n-type antimony telluride ($Sb_2Te_3$) or an n-type bismuth selenide alloy ($Bi_2Te_{3-x}Se_x$).

9. The method of claim 7, wherein:
the first n-type semiconductor material layer comprises a first periodic table Group V-VI, II-VI, or IV compound doped to form a first n-type semiconductor material; and
the second n-type semiconductor material layer comprises a second periodic table Group V-VI, II-VI, or IV compound doped to form a second n-type semiconductor material.

10. The method of claim 3, wherein:
the first strip made of the second material is a first carrier substrate and the second strip made of the second material is a second carrier substrate;
the method further comprises:
forming the p-type superlattice structures on the first carrier substrate made of the second material;
dicing the first carrier substrate with the p-type superlattice structures to generate the strip of p-type thermoelectric structures;
forming the n-type superlattice structures on the second carrier substrate made of the second material; and
dicing the second carrier substrate with the n-type superlattice structures to generate the strip of n-type thermoelectric structures; and
the removing of the second material comprises removing diced portions of the first and second carrier substrates from the p-type and n-type superlattice structures.

11. The method of claim 10, wherein the disposing of the strips of p-type and n-type thermoelectric structures comprises:
disposing each of the n-type superlattice structures adjacent to a corresponding one of the p-type superlattice structures.

12. The method of claim 10, wherein:
a diameter of the first carrier substrate is less than a diameter of the carrier wafer; and
a diameter of the second carrier substrate is less than the diameter of the carrier wafer.

13. The method of claim 1, wherein each of the p-type and n-type thermoelectric structures comprises a superlattice structure.

14. The method of claim 1, wherein:
the forming of the electrical contacts comprises:
forming the first subset of the electrical contacts on a top surface of each respective one of a first subset of the p-type and n-type thermoelectric structures, and
forming the second subset of the electrical contacts on a top surface of each respective one of a second subset of the p-type and n-type thermoelectric structures.

15. The method of claim 14, wherein a diameter of each of the first subset of the electrical contacts is at least about five times larger than a diameter of each of the second subset of the electrical contacts.

16. The method of claim 14, wherein:
a thickness of the first top header is about equal to a thickness of the second top header; and
a first surface area of the first top header is different from a second surface area of the second top header.

17. The method of claim 1, wherein the thermoelectric device modules comprise at least one hundred thermoelectric device modules.

18. The method of claim 1, wherein the thermoelectric device modules comprise:
the first thermoelectric device module configured to perform electronics cooling;
the second thermoelectric device module configured to perform refrigeration;
a third thermoelectric device module configured to perform air conditioning;
a fourth thermoelectric device module configured to perform thermal control; or
a fifth thermoelectric device module configured to perform thermal energy harvesting.

19. The method of claim 1, wherein the forming electrical contacts on a top surface of each of the strip of p-type thermoelectric structures and the strip of n-type thermoelectric structures comprises combining photolithography and electroplating on a top surface of each respective one of the p-type and the n-type thermoelectric structures.

20. The method of claim 19, wherein combining photolithography and electroplating comprises electroplating the top surface of each of the strip of p-type thermoelectric structures and the strip of n-type thermoelectric structures through a photolithographic opening disposed on each of the strip of p-type thermoelectric structures and the strip of n-type thermoelectric structures.

21. The method of claim 2, wherein the carrier wafer comprises a handle wafer having at least an eight-inch diameter.

22. The method of claim 21, wherein the handle wafer comprises at least 100 P-N couples.

23. The method of claim 21, wherein the handle wafer comprises at least 1,100 P-N couples.

24. The method of claim 21, wherein the handle wafer comprises at least 100,000 P-N couples.

25. The method of claim 21, wherein the handle wafer comprises at least 440,640 P-N couples.

26. The method of claim 21, wherein the handle wafer comprises at least 688,500 P-N couples.

* * * * *